(12) United States Patent
Ryoji et al.

(10) Patent No.: US 6,211,622 B1
(45) Date of Patent: Apr. 3, 2001

(54) PLASMA PROCESSING EQUIPMENT

(75) Inventors: Makoto Ryoji, Moriya-machi; Takeshi Hasegawa, Tsukuba; Masahito Ban; Yukitaka Mori, both of Noda, all of (JP)

(73) Assignee: Kawasaki Jukogyo Kabushiki Kaisha, Hyogo-ken (JP)

( * ) Notice: Subject to any disclaimer, the term of this patent is extended or adjusted under 35 U.S.C. 154(b) by 0 days.

(21) Appl. No.: 09/435,768

(22) Filed: Nov. 8, 1999

(30) Foreign Application Priority Data

Nov. 10, 1998 (JP) .................................................. 10-318487

(51) Int. Cl.⁷ ............................... H01J 27/02; H05H 1/24

(52) U.S. Cl. ................................ 315/111.21; 315/111.71; 118/723 HC; 313/231.31

(58) Field of Search ........................ 315/111.21, 111.71; 118/723 HC; 313/231.31

(56) References Cited

U.S. PATENT DOCUMENTS 5,942,854    8/1999   Ryoji et al. .

FOREIGN PATENT DOCUMENTS

2287792  * 5/1976  (FR) ................................ 315/111.91
11-67491    3/1999  (JP) .

* cited by examiner

Primary Examiner—Michael B Shingleton
(74) Attorney, Agent, or Firm—Oliff & Berridge PLC.

(57) ABSTRACT

A plurality of extracting orifices 42 for extracting the electron beam from a discharge portion 2 into a plasma process chamber 3 via a compartment 4 are provided radially. A plurality of accelerating electrodes 36, 37 are arranged in the process chamber 3. The electron extracting direction from the extracting orifices 42 is set in substantially parallel with an object surface 35. The number and the arrangement of the accelerating electrodes 36, 37 are set such that a density distribution of the excited plasma has an oprimal state for processing the object. The object having a large area can be processed appropriately.

37 Claims, 19 Drawing Sheets

$(C_1, C_2, C_3) = (100, -100, 100)$ $(C_1, C_2, C_3) = (100, -150, 100)$ $(C_1, C_2, C_3) = (100, -50, 100)$

PLASMA PROCESSING EQUIPMENT

BACKGROUND OF THE INVENTION

1. Field of the Invention

The present invention relates to a plasma processing equipment which is used to process an object with electron-beam excited plasma. More particularly, the present invention relates to a structure of a process chamber for ionizing a process gas and processing an object and a structure of its peripheral portion.

2. Description of the Related Art

The electron-beam excited plasma processing equipment is widely used for the plasma processing, i.e., plasma ion plating, plasma CVD, plasma sputtering, plasma etching, etc. The electron-beam excited plasma processing equipment comprises a discharge chamber which is filled with the discharge plasma being generated by ionizing the inert gas, and a process chamber in which various reactions are generated by ionizing the process gas by virtue of the electron beam which is extracted from the discharge plasma via the orifice and then accelerated by the accelerating electrode.

As well known in the art, the cathode, the intermediate electrode, the discharge electrode, and the accelerating electrode are arranged in the discharge chamber. When the discharge voltage is applied between the cathode and the discharge electrode, thermions which are discharged from the cathode act to the inert gas which is supplied to the cathode portion to generate the discharge plasma, and thus such discharge plasma fills a space between the intermediate electrode and the discharge electrode in the discharge chamber. Thus, when the accelerating voltage is applied between the discharge electrode and the accelerating electrode, electrons are extracted from the discharge plasma in the discharge chamber and then accelerated to supply the large-current electron beam to the process chamber.

Various process gases such as a silane gas, a methane gas, etc. are supplied to the process chamber in response to the necessity of the reaction process. Various plasma processes are carried out on a surface of the object loaded in the process chamber, e.g., activated species (radicals) are generated by ionizing and dissociating the reactive process gas by means of the electron beam and then deposited on a substrate. Ions in the plasma are injected vertically into the object in accordance with difference between the plasma potential and the object surface potential, or the like.

In the electron-beam excited plasma processing equipment in which the accelerated electron beam is injected in the vertical direction to the object surface, if a gas pressure in the process chamber is low, a high energy component of the beam is irradiated directly into the object and thus a physical etching action of the ions with high energy is increased on the object surface. Therefore, the surface of the object is damaged or the film forming process cannot be performed succeedingly. In addition, for example, in the case of DRAM etching, defects such as degradation or destruction of a gate oxide film is caused since a floating potential on the object surface is distributed over the overall object.

It is effective against above problems to increase the number of times of collision of the beam with gas particles by increasing a gas pressure, or to attenuate the high energy component of the beam by increasing a distance between an irradiation port of the electron beam and the object. However, if the gas pressure is increased, the plasma density near the port of the electron beam becomes higher because the number of collision times increases, and the plasma can not be spread widely.

As a result, uniform plasma with a large diameter can not be obtained.

Therefore, such a problem is caused that uniformity of the plasm reaction on the object surface is deteriorated. Also, to increase the distance is not preferable because a size of the equipment is enlarged.

Meanwhile, there is a beam parallel injection type electron-beam excited plasma processing equipment in which the electron beam is accelerated in the direction parallel with the object surface not to directly irradiate the high energy component of the beam onto the object.

According to this equipment, since the object surface is set in parallel with an electron beam axis in the process chamber and thus the high energy component of the beam is not directly irradiated onto the object, the floating potential on the object surface has a gentle distribution.

However, the plasma density is high near the accelerating electrode but such plasma density is reduced as a location becomes remote from the accelerating electrode. Therefore, there is such a problem that the film forming rate, etc. are different on the upstream side and the downstream side of the electron beam on the object surface and thus the film quality, etc. are not uniform. Moreover, especially it is difficult to fabricate the object with a large area.

In both plasma processing equipments, since the electrons are supplied via a single extracting orifice, the plasma density to be generated is limited.

As described above, in the technical field of the electron-beam excited plasma processing equipment, such problems are treated in the related art that the object having the larger area should be formed by relaxing the ion impact action and that the object should be fabricated effectively by increasing the material plasma density and improving the uniformity of the plasma.

In order to overcome such problem, the ring type electron-beam excited plasma processing equipment has been proposed.

In this equipment, a plurality of extracting orifices for extracting the electrons from the discharge chamber which is filled with the discharge plasma are provided radially such that their electron extracting directions are set in the substantially vertical direction to the electron incident direction toward the discharge portion. Then, the process gas in the process chamber can be ionized by extracting and accelerating the electron beam by virtue of the accelerating electrode being provided in the process chamber, and then the plasma can be applied to the object surface which is provided in substantially parallel with the electron extracting direction.

In this equipment, since a number of extracting orifices are arranged radially in the compartment being projected into the process chamber, the plasma density in the process chamber can be enhanced by extracting the large-current electron flow from the discharge chamber to thus improve an efficiency of the plasma reaction. In addition, since the high energy component of the beam does nut directly collide with the object surface and thus the uneven physical etching action, etc. can be eliminated, uniform process can be applied to the large area object.

Furthermore, since the accelerating electrode is provided separately from the inner wall of the process chamber, an amount of the plasma which flows into the inner wall of the process chamber can be reduced to thus suppress the increase of the inner wall temperature. Therefore, generation of the impurity from the inner wall and entering of the impurity into the formed film can be prevented.

If the self-heating type accelerating electrode is employed in the equipment, the insulating DLC (diamond-like-carbon) which is deposited onto the accelerating electrode as a film when a methane gas is used as the process gas can be changed in quality into the conductive graphite. Therefore, the stable discharge can be maintained for a long period of time.

However, in the ring type electron-beam excited plasma processing equipment, the distance between the object table and the electron extracting ports of the discharge electrode must be set sufficiently large to assure the uniformity of the plasma, and also the film forming rate cannot be enoughly increased because the plasma density is lowered when the object with the large area is treated. In addition, if the distance between the electron extracting ports and the accelerating electrode is increased to treat the object with the large area, the acceleration be unstable when a high-pressure process gas is employed so as to increase the film forming rate.

In this way, the limitation is imposed on the object area as the object and also the limitation is imposed on the increase in the film forming rate.

Also, since the applied power is limited in the equipment which has only one discharge portion for generating the discharge plasma, the film forming rate cannot be increased and the partition is damaged because the power is concentrated to the orifice. Further, since the equipment in the related art has the small power, a decomposition efficiency of the process gas is low and also the process gas is used wastefully, so that a production cost is raised.

Furthermore, since the plasma distribution is limited in the equipment in the related art, the relatively uniform surface action can be applied only to the circular object. As a result, it is difficult for the equipment in the related art to process the large-size square glass substrate, etc.

SUMMARY OF THE INVENTION

Therefore, it is an object of the present invention to make it possible to apply a film forming process to an object, which has a larger area, at a high speed in the electron-beam excited plasma processing equipment, and also apply a process to an object other than a circular object with little ineffectiveness.

In order to achieve the above object, according to an aspect of the present invention, there is provided a plasma processing equipment comprising a discharge vessel in which a discharge chamber for generating a discharge plasma is formed; a vacuum vessel in which a process chamber for generating an excited plasma by exciting a process gas by virtue of electrons which are extracted from the discharge plasma is formed; a partition in which a compartment is formed, said compartment being communicated with the discharge chamber and protruding into the process chamber, said partition having a plurality of orifices for extracting the electrons from the discharge plasma toward the process chamber, the orifices being formed such that the electrons are emitted through the orifices along a direction parallel to a processed surface of an object which is to be processed by the excited plasma, and a plurality of accelerating electrodes arranged in the process chamber to extract the electrons through the orifices, wherein a number and an arrangement of the accelerating electrodes are set such that a density distribution of the excited plasma has an optimal state for processing the object.

According to another aspect of the present invention, there is provided a plasma processing equipment comprising a discharge vessel in which a discharge chamber for generating a discharge plasma is formed; a vacuum vessel in which a process chamber for generating an excited plasma by exciting a process gas by virtue of electrons which are extracted from the discharge plasma is formed; a partition in which a compartment is formed, said compartment being communicated with the discharge chamber and protruding into the process chamber, said partition having a plurality of orifices for extracting the electrons from the discharge plasma toward the process chamber, the orifices being formed such that the electrons are emitted through the orifices along a direction parallel to a processed surface of an object which is to be processed by the excited plasma; accelerating electrodes arranged in the process chamber to extract the electrons through the orifices; and a magnetic field applying mechanism for applying a magnetic field to an inside of the process chamber to generate a magnetic field strength distribution which has a region, in which a strength of the magnetic field becomes minimal, on a flat plane which is parallel with the processed surface of the object and contains the orifices.

According to still another aspect of the present invention, there is provided a plasma processing equipment comprising a discharge vessel in which a discharge chamber for generating a discharge plasma is formed; a vacuum vessel in which a process chamber for generating an excited plasma by exciting a process gas by virtue of electrons which are extracted from the discharge plasm is formed; a partition in which a compartment is formed, said compartment being communicated with the discharge chamber and protruding into the process chamber, said partition having a plurality of orifices for extracting the electrons from the discharge plasma toward the process chamber, the orifices being formed such that the electrons are emitted through the orifices along a direction parallel to a processed surface of an object which is to be processed by the excited plasma; and accelerating electrodes arranged on a surface of the partition facing said process chamber to extract the electrons through the orifices.

According to yet still another aspect of the present invention, there is provided a plasma processing equipment comprising a discharge vessel in which a discharge chamber for generating a discharge plasma is formed; a vacuum vessel in which a process chamber for generating an excited plasma by exciting a process gas by virtue of electrons which are extracted from the discharge plasma is formed; a partition in which a compartment is formed, said compartment being communicated with the discharge chamber and protruding into the process chamber, said partition having a plurality of orifices for extracting the electrons from the discharge plasma toward the process chamber, the orifices being formed such that the electrons are emitted through the orifices along a direction parallel to a processed surface of an object which is to be processed by the excited plasma; and an accelerating electrode for extracting the electrons through the orifices, wherein said accelerating electrode has a gas supplying port for introducing the process gas into the process chamber.

According to yet still another aspect of the present invention, there is provided a plasma processing equipment comprising a discharge vessel in which a discharge chamber for generating a discharge plasma is formed; a vacuum vessel in which a process chamber for generating an excited plasma by exciting a process gas by virtue of electrons which are extracted from said discharge plasma is formed; a partition in which a compartment is formed as annular shape, said annular compartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma; and an accelerating electrode formed as annular shape and arranged in said process chamber so as to surround said partition to extract said electrons through said orifices.

According to the electron-beam excited plasma processing equipment of the present invention, without a long distance between an electron emitting position and a surface of an object table, high-speed plasma processing can be applied to an object having a large area by generating a uniform and high-density plasma over a wide area.

Also, the electron-beam excited plasma processing equipment of the present invention can deal with a large-size square substrate, etc. by adjusting a plasma profile. In addition, thin film formation can be achieved in compliance with any deposition schedule by controlling activated species in the plasma.

DESCRIPTION OF THE PREFERRED EMBODIMENTS

Electron-beam excited plasma processing equipments according to respective embodiments of the present invention will be explained in detail with reference to the accompanying drawings hereinafter.

[Embodiment 1]

FIGS. 1 to 6 are sectional views showing an electron-beam excited plasma processing equipment according to a first embodiment of the present invention.

Figure 1:
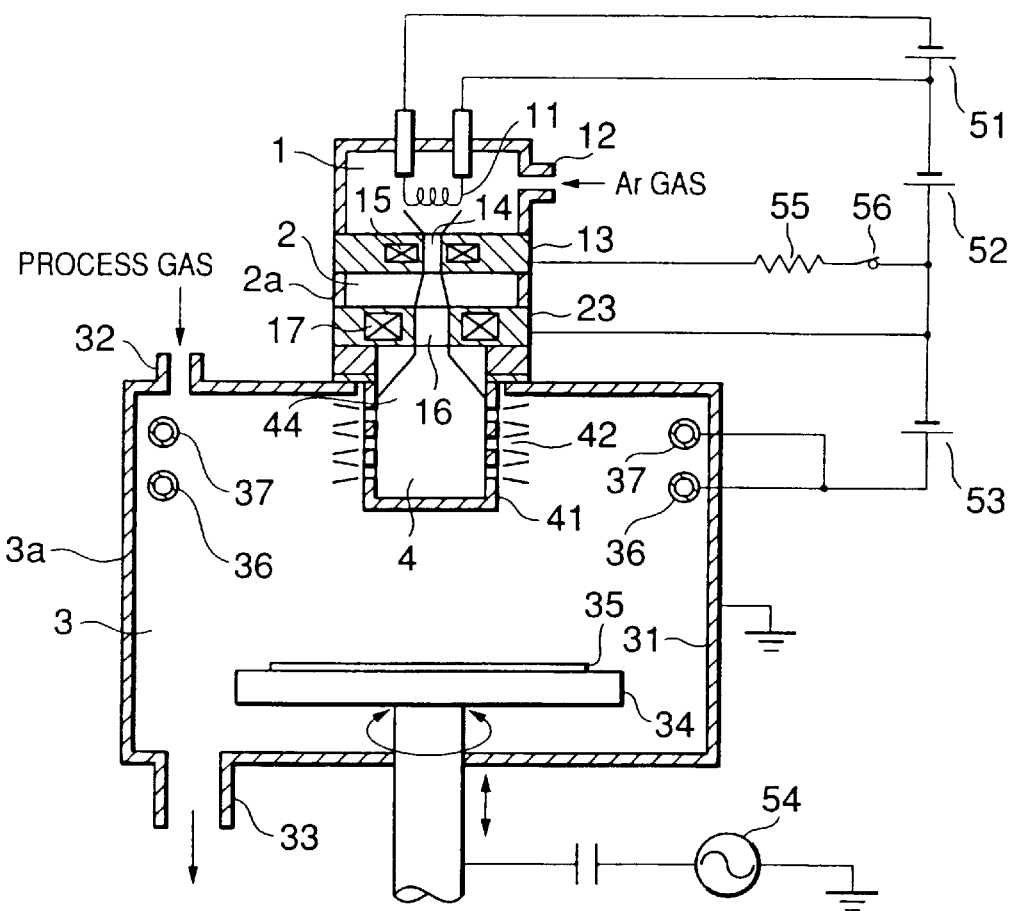
FIG. 1 is a sectional view showing an electron-beam excited plasma processing equipment according to a first embodiment of the present invention.

In FIG. 1, in the electron-beam excited plasma processing equipment according to the first embodiment, a cathode chamber 1, a discharge chamber 2, a process chamber 3, and a compartment 4 are aligned vertically. The discharge chamber 2 is formed inside a discharge vessel 2a. The process chamber 3 is formed inside a vacuum vessel 3a.

The cathode chamber 1 and the discharge chamber 2 are separated by an intermediate electrode 13. A cathode 11 having a filament for emitting thermions is provided in the cathode chamber 1. A nozzle 12 is provided to the cathode chamber 1 to supply an inert gas such as an argon (Ar) gas, etc. A through hole 14 is formed in the center of the intermediate electrode 13 to flow the inert gas and the electrons into the discharge chamber 2. An air-core coil 15 is fitted into the intermediate electrode 13 coaxially with the through hole 14.

The discharge chamber 2 is a space formed between the intermediate electrode 13 and a discharge electrode 23. The discharge electrode 23 is positioned immediately below the intermediate electrode 13 but immediately above the compartment 4. The plasma of the inert gas can be generated by the electron flow, which is supplied by the cathode 11 and the discharge electrode 23, in the discharge chamber 2.

Also, an air-core coil 17 is buried in the discharge electrode 23. Most of the electron flow being passed through an orifice 14 of the intermediate electrode 13 does not directly flow into the discharge electrode 23, but is passed through an orifice 16 of the discharge electrode 23 to then flow into the compartment 4.

The compartment 4 has a cylindrical shape to project into the process chamber 3 and is filled with the discharge plasma 44 which is generated by the injected electron flow. A plurality of through holes, i.e., extracting orifices 42 are provided in a circular portion of a partition 41 which separates the copartment 4 from the process chamber 3 to form extracting orifices for the electron beam. The extracting orifices 42 are formed to emit the electron beam in the horizontal direction in FIG. 1.

A plurality of independent accelerating electrodes 36, 37, a gas nozzle 32 for introducing the process gas, and an exhaust port 33 being connected to a vacuum equipment (not shown) are provided in the vacuum vessel 3a.

The accelerating electrodes 36, 37 are a ring type electrode formed to circulate a periphery of the compartment 4, and are provided to positions opposing to the extracting orifices 42. A cooling water or a heat carrier is flown in the inner cavity of the ring to perform the degas before the processing step or the electrode cooling during the processing step. Meanwhile, when the carbon series insulating film is formed, the deposited insulating film can be changed into the conductive film by heating the accelerating electrode up to 400° C. to maintain the electron accelerating performance.

In addition, an object holder 34 is provided to a position opposing to the compartment 4. The object holder 34 has a structure which can load an object 35 thereon and then rotate and move vertically.

Above-mentioned electrodes 11, 13, 23, 36, 37 are connected to an external DC power supply consisting of a heating power supply 51, a discharge power supply 52, and an accelerating power supply 53, which are connected in series. The currents/voltages necessary for the plasma formation and the plasma reaction are supplied to the electrodes. In other words, the heating power supply 51 supplies a heating current to the filament of the cathode 11, and both terminals of the discharge power supply 52 are connected to the cathode 11 and the discharge electrode 23 to supply the discharge voltage to them, and an anode of the accelerating power supply 53 is connected to the accelerating electrodes 36, 37 to supply the accelerating voltage such that the electrons can be extracted from the plasma 44 in the compartment 4. In this case, the intermediate electrode 13 is connected to the anode of the discharge power supply 52 via a resistor 55 and a switch 56.

Then, the object holder 34 is connected to a high frequency power supply unit 54. Thus, an ion irradiating energy onto the object surface can be controlled by applying an appropriate RF bias voltage to the object holder 34.

An argon gas as the plasma species is supplied to the cathode chamber 1. when the current is supplied to the cathode 11 from the heating power supply 51, the thermions are emitted to the surrounding. When the voltage of the discharge power supply 52 is applied to the discharge electrode 23 while supplying the argon gas, the discharge is generated between the cathode 11 and the discharge electrode 23 with the intervention of initial discharge caused between the cathode 11 and the intermediate electrode 13.

The electron flow which is made sufficiently narrow by the action of the coil 15 being fitted in the intermediate electrode 13 can be paused through the through hole 14. At this time, Since the magnetic field distribution in the discharge chamber 2 can be adjusted based on the winding direction and the current of the coil 17 being fitted in the discharge electrode 23, the electrons can pass through the orifice 16 of the discharge electrode 23 to flow into the compartment 4. As a result, the inert gas supplied from the cathode chamber 1 can be ionized effectively.

The process gas is supplied via the gas supply port 32 and is exhausted via the exhaust port 33. A pressure in the process chamber 3 can be held constant during the plasma reaction by a pressure adjusting mechanism (not shown).

When the voltage of the accelerating power supply 53 is applied to the discharge electrode 23 and between the accelerating electrodes 36, 37 being provided in the process chamber 3, the electron flow can be extracted from the plasma 44 in the compartment 4 into the process chamber 3 via the extracting orifices 42. The flowing-out direction of the electron flow being extracted from the plasma is set substantially vertically relative to the direction of the discharge current in the discharge chamber 2.

The electron flow, which is extracted from the argon discharge plasma in the compartment 4, can ionize/dissociate the molecules of the process gas in the process chamber 3 into the process plasma. Because a number of extracting orifices 42 are provided in the periphery of the compartment 4 and the electron beam in the process chamber 3 has high energy component, ionization/dissociation efficiency of the process gas is enhanced. As a result, the material plasma density can be high.

The ionized process gas reacts with the object 35 loaded on the object table 34, and the product according to each purpose is produced.

In this case, the electron flow which is extracted from the compartment 4 travels in parallel with the surface of the object table 34 in the process chamber 3 and thus the electron flow never directly collides with the surface of the object 35. Therefore, the floating potential on the object surface becomes uniform because the reduction of the floating potential due to the injection of the electrons can be decreased.

In the event that a wall 31 defining the process chamber 3 is employed as the accelerating electrode, the plasma density over the object 35 cannot be corrected even if such plasma density shows the uneven distribution, such that the plasma density is high in the vicinity of the extracting orifices 42 and is low near the periphery of the process chamber 3. Therefore, in order to achieve the flat distribution of the plasma density near the object surface by relaxing the unevenness of the plasma density, an appropriate distance must be set between the orifices 42 and the object 35 with the result that the size of the equipment is increased.

On the other hand, in the first embodiment, the plasma having the desired density distribution can be formed in the process chamber 3 by providing a plurality of accelerating electrodes 36, 37 inside the process chamber 3 as well as adjusting the number and the position of these accelerating electrodes 36, 37, in place of utilizing the wall 31 defining the process chamber 3 as the accelerating electrode. Hence, the overall surface of the large-size object 35 can be processed uniformly without the increase in size of the process chamber 3.

Then, the number and the position of these accelerating electrodes 36, 37 will be explained in detail hereunder.

Figure 2:
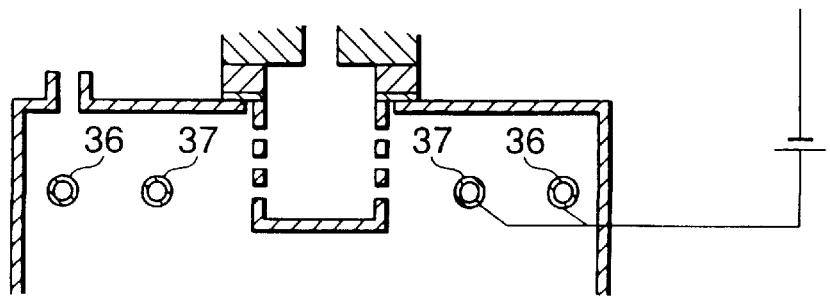
FIG. 2 is a sectional view showing an example of an accelerating electrode arrangement in the equipment according to the fist embodiment of the present invention.

For instance, as shown in FIG. 2, when two independent accelerating electrodes 36, 37 each having a different diameter are aligned along the radial direction of the orifices 42, the electron density can be enhanced in the vicinity of these accelerating electrodes 36, 37. Therefore, such an advantage can be achieved that the high density portion of the process plasma can be extended and thus a region to make the uniform plasma processing possible can be expanded.

Figure 3:
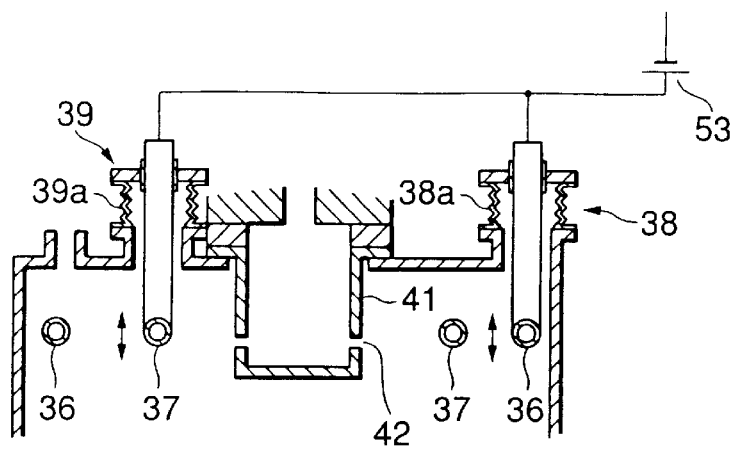
FIG. 3 is a sectional view showing an example using accelerating electrode position adjusting mechanisms in the equipment according to the first embodiment of the present invention.

Also, as shown in FIG. 3, accelerating electrode position adjusting mechanisms 38, 39 for adjusting vertical positions of the accelerating electrodes 36, 37 via vacuum bellows 38a, 39a is provided so as to set the plasma density distribution into the preferable state by adjusting the spread of the electron flow and the electron density. For example, since the plasma density on the area in the neighborhood of the center becames thin if the accelerating electrode 37 provided on the inner side is pulled up, the plasma density on the object surface can be uniformized.

In this case, as shown in FIG. 3, a plurality of extracting orifices 42 may be provided at a predetermined height not to distribute along the height direction on the external periphery of the partition 41. Such a configuration that the extracting orifices 42 are distributed on one flat plane makes the design easy when arrangement of the accelerating electrodes 36, 37, etc. must be adjusted to obtain a desired plasma distribution.

Figure 4:
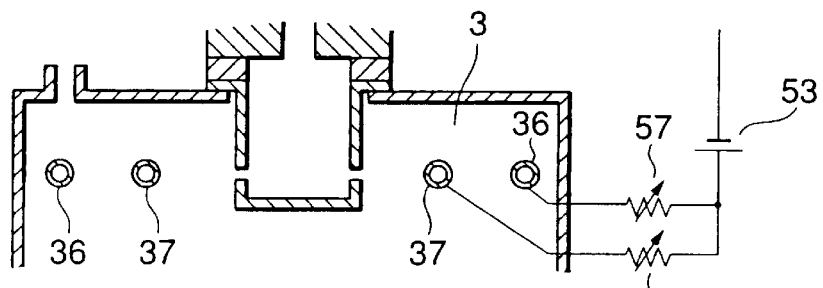
FIG. 4 is a sectional view showing an example of a method of adjusting a current being input into accelerating electrodes in the equipment according to the first embodiment of the present invention.

Then, as shown in FIG. 4, the accelerating electrodes 36, 37 are connected to the accelerating persupply 53 via a variable resistors 57, 58, respectively. The plasma density distribution in the process chamber 3 can be changed by controlling current values passed through the variable resistors 57, 58 by adjusting their resistance values, respectively. As a result, the plasma density on the object surface can be formed uniformly.

Figure 5:
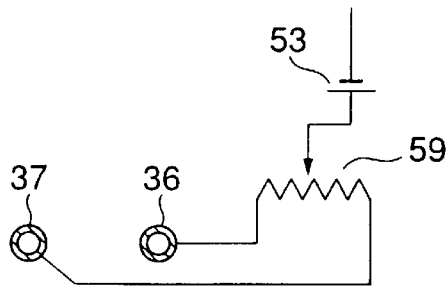
FIG. 5 is a circuit diagram showing another example of the method of adjusting the current being input into the accelerating electrodes in the equipment according to the first embodiment of the present invention.

As shown in a circuit diagram of FIG. 5, in place of providing independently the variable resistors to the accelerating electrodes 36, 37, the accelerating electrodes 36, 37 may be connected to both end terminals of a variable resistor 59, respectively and then the accelerating power supply 53 is connected to a variable terminal of the variable resistor 59. According to such configuration, not only the number of parts can be reduced, but also input currents for two accelerating electrodes 36, 37 can be adjusted at the same time.

Figure 6:
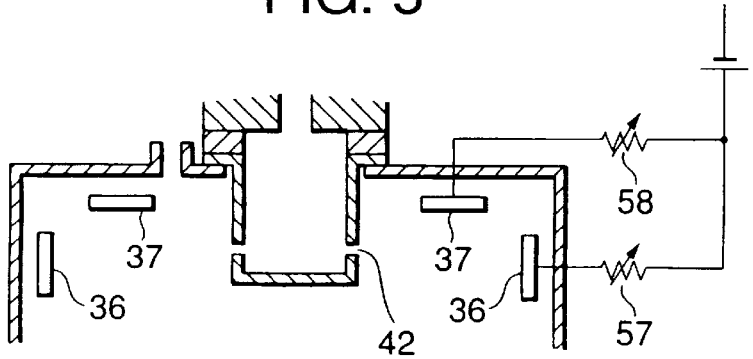
FIG. 6 is a sectional view showing an example of an accelerating electrode arrangement in the equipment according to the first embodiment of the present invention.

FIG. 6 shows an arrangement example in which a first accelerating electrode having a cylindrical shape is arranged at a position opposing to the orifices 42 and a second accelerating electrode having an annular disk shape is arranged at a position opposing to the object. The input current values can be controlled by adjusting the resistors 57, 58 connected to respective accelerating electrodes, so that the shape of the electron flow extracted via the orifices 42 can be adjusted. As a result, the plasma density on the object surface can be formed uniformly.

In this case, permanent magnetics may be employed instead of the air-core coils 15, 17 which are fitted in the intermediate electrode 13 and the discharge electrode 23. The air-core coils 15, 17 can be provided outside of the intermediate electrode 13 and the discharge electrode 23.

[Embodiment 2]

FIGS. 7 to 10 are sectional views showing an electron-beam excited plasma processing equipment according to a second embodiment of the present invention. This second embodiment is mainly different from the first embodiment in that a plurality of compartments are provided. Since most of the constituent elements are used cononly, the same reference numerals are attached to elements which have the same functions as those in FIGS. 1 to 6 and their redundant explanation will be omitted. Similarly, in the succeeding embodiments, like reference numerals denote the elements which have the same functions as those in FIGS. 1 to 6.

In the electron-beam excited plasma processing equipment according to the second embodiment, a plurality of compartments 4 are provided to project into the process chamber 3, a first ring-type accelerating electrode 36 is provided to surround the compartment 4 being arranged inside, and a second ring-type accelerating electrode 37 is provided to surround all compartments 4 being arranged inside and outside. Two accelerating electrodes 36, 37 are provided at the same height.

The process gas is supplied into the process chamber 3 via ring type shower nozzles 45, 46, 47 which are provided to surround the compartments 4, respectively. The supplied process gas is passed through a highest portion of the plasma density between the extracting orifices 42 and the accelerating electrodes 36, 37 to reach the object 35. Therefore, a decomposition efficiency of the process gas becomes high.

In addition, since the spread of the process gas plasma is increased, the uniform plasma processing can be achieved even when the object 35 has the large area.

The complicated process can also be carried out by changing the type of the process gas every compartment 4.

A ring type shower nozzle 38 is provided at a position in the neighborhood of the object table 34, where the plasma density is not so high. The shower nozzle 38 is used when the process gas is supplied in the process during which preferably the gas deposition should not be so advanced, etc.

For example, a methane $CH_4$ is used to form a carbon series film. It is recognized that in the methane $CH_4$ plasma, neutral active radicals such as $CH_3$, $CH_2$, CH, C, etc. or ions exist in compliance with a level of decomposition. It is preferable that, when a DLC (diamond-like-carbon) film of the carbon films is formed, $CH_3$, of the plasma particles, which has a low decomposition level, should be used.

Also, when the crystallite silicon used as a solar cell is fabricated, $SiH_4$ is used as the plasma processing gas. However, it is preferable that, since the defect density is increased in SiH or $SiH_4$ which has advanced decomposition, $SiH_3$, having a lowest decomposition level should be deposited.

In some cases the type of the activated species in the plasma must be controlled to obtain the desired film quality. If the supply port of the process gas is fixed to a single port, it is difficult to adjust a dissociation degree of the process gas, so that the film quality which is required for each purpose cannot be obtained.

According to the electron-beam excited plasma processing equipment according to the second embodiment, the type and amount of the activated species in the plasma which comes up to the object surface can be controlled by using properly various gas supply ports without the change of running conditions of the electron-beam generating equipment, whereby the high quality thin film process can be achieved.

Figure 8:
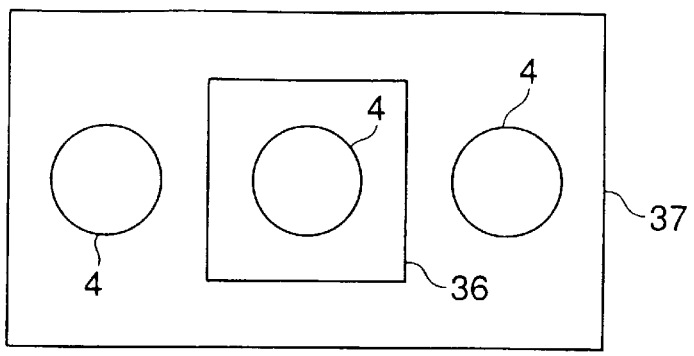
FIG. 8 is a plan view showing an example of an accelerating electrode and compartment arrangement in the equipment according to the second embodiment of the present invention.
Figure 9:
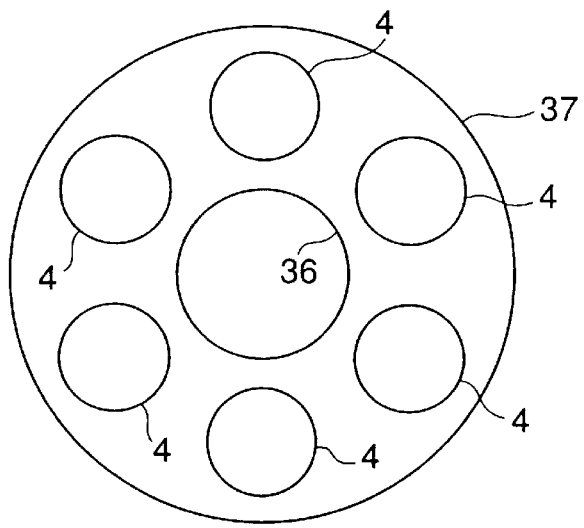
FIG. 9 is a plan view showing another example of the accelerating electrode and compartment arrangement in the equipment according to the second embodiment of the present invention.
Figure 10:
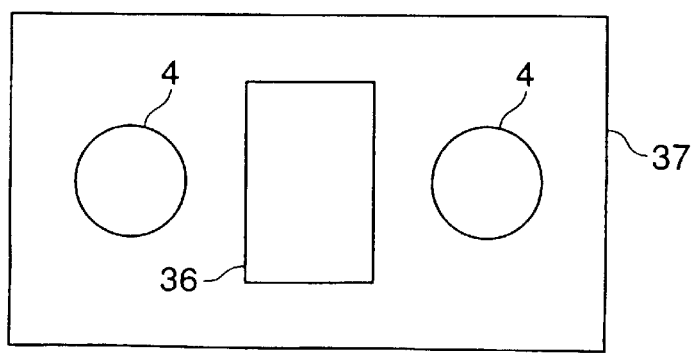
FIG. 10 is a plan view showing still another example of the accelerating electrode and compartment arrangement in the equipment according to the second embodiment of the present invention.

FIGS. 8 to 10 are plan views each showing a positional relationship between the compartments 4 and the accelerating electrodes 36, 37 employed in the process chamber 3 in the second embodiment.

Figure 7:
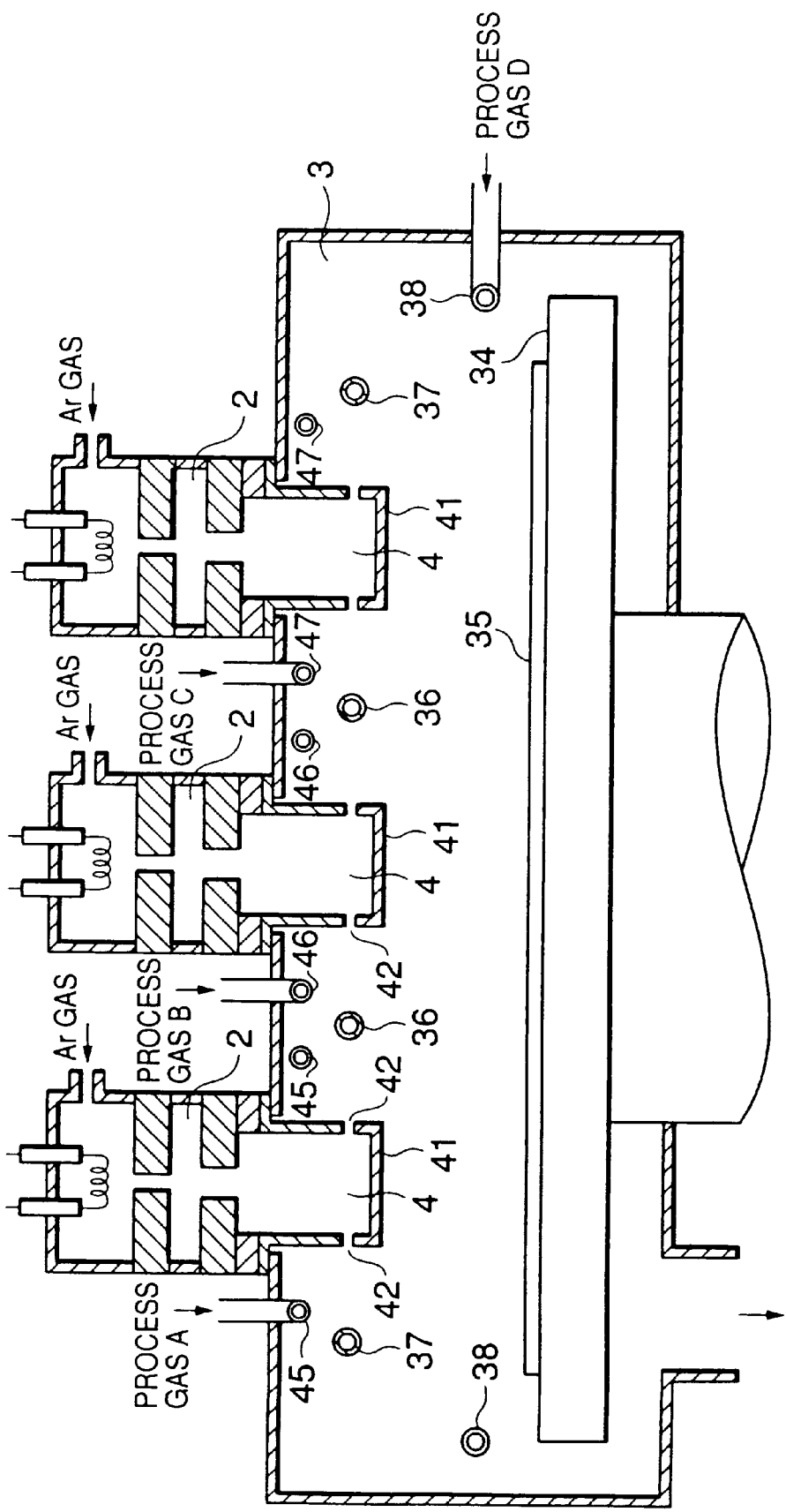
FIG. 7 is a sectional view showing an electron-beam excited plasma processing equipment according to a second embodiment of the present invention.

FIG. 8 shows an arrangement example which corresponds to the electron-beam excited plasma processing equipment shown in FIG. 7. Three compartments 4 are aligned linearly. A first square accelerating electrode 36 is provided to surround the center compartment 4, and a second rectangle accelerating electrode 37 is provided to surround the overall compartments 4.

Since the applied power of each discharge chamber 2 is limited, it is difficult to increase the film forming rate with respect to the large-size object in the configuration in which only one discharge chamber 2 is provided. It the output is increased in such configuration, in some cases melting or damage of the partition 41 is generated because the power is concentrated onto the orifices 42. Also, if the plasma processing is applied to the square object 35, it is difficult to set the plasma density uniformly on all the corners of the object surface.

The arrangement shown in FIG. 8 is fitted for the rectangular large-area object such as liquid crystal, solar cell, etc. Therefore, the applied power can be distributed by employing a plurality of discharge chambers 2 to avoid the load concentration. Also, the uniform plasma density distribution can be formed on the overall square object surface by adjusting the accelerating voltage applied to the accelerating electrodes 36, 37 or adjusting the height of the accelerating electrodes.

In addition, if the film is formed while transferring the object at a constant speed along the direction perpendicular to the vertical center axis of the square plasma, which is generated according to the arrangement shown in FIG. 8, uniform film formation can be achieved on the very large size substrate.

FIG. 9 shows another example wherein six compartments 4 are arranged at equal angular intervals between the first accelerating electrode 36 and the second accelerating electrode 37, both are arranged concentrically. The film formation of uniform quality can be achieved on the circular large area substrate by performing the similar adjustment.

FIG. 10 shows the electron-beam excited plasma processing equipment which has two compartments 4. A first square accelerating electrode 36 is arranged between the compartments 4, and a second square accelerating electrode 37 is arranged to surround the accelerating electrode 36 and the compartments 4. Since the plasma density is apt to increase in an area located between two compartments 4, the density distribution is uniformized by slightly suppressing an action of the first accelerating electrode 36, for example. This plasma processing equipment may be employed to process the smaller square object than that processed by the equipment shown in FIG. 8.

[Embodiment 3]

Figure 11:
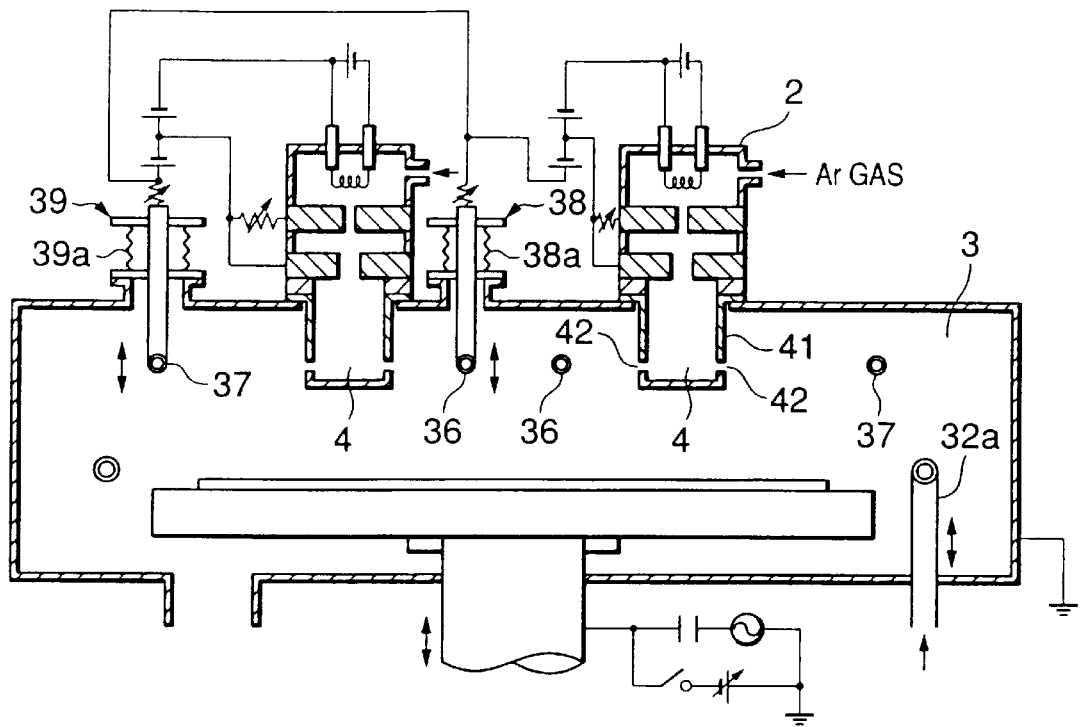
FIG. 11 is a sectional view showing an electron-beam excited plasma processing equipment according to a third embodiment of the present invention.
Figure 12:
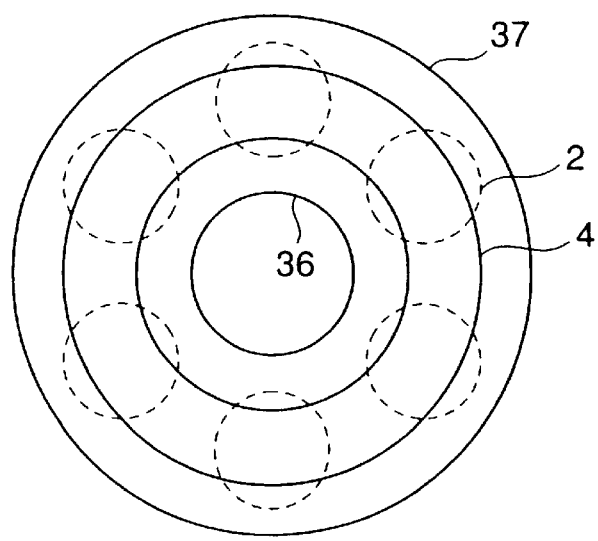
FIG. 12 is a plan view showing an example of an accelerating electrode and compartment arrangement in the equipment according to the third embodiment of the present invention.

FIG. 11 is a sectional view showing an electron-beam excited plasma processing equipment according to a third embodiment of the present invention. FIG. 12 is a plan view showing a positional relationship between a compartment 4 and accelerating electrodes 36, 37 in the third embodiment.

A first ring-type accelerating electrode 36 and a second ring-type accelerating electrode 37 are arranged coaxially in the process chamber 3, and a doughnut-type compartment 4 is arranged between the first accelerating electrode 36 and the second accelerating electrode 37. The electrons are extracted from the extracting orifices 42 provided in an inner partition 41 and accelerated toward the first accelerating electrode 36, and also the electrons are extracted from the outer extracting orifices 42 and accelerated toward the second accelerating electrode 37. Thus, the process gas in the process chamber 3 is dissociated/ionized.

Six discharge chambers 2 are arranged at equal angular intervals in the doughnut-type compartment 4. The discharge plasma distribution in the compartment 4 can be uniformized by adjusting the discharge current and a flow rate of the gas in the discharge chamber 2, respectively.

In addition, the plasma distribution can be adjusted by changing heights of the accelerating electrode 36, 37 by using electrode position adjusting mechanisms 38, 39. In the third embodiment, a height of a gas nozzle 32a can be changed. The plasma distribution can also be adjusted by changing the height of the gas nozzle 32a.

Since the campartment 4 is formed like a doughnut and also the plasma density in the inside is made uniform, it is possible to make the process plasma density distribution much more uniform near the object surface which is set in the process chamber 3.

[Embodiment 4]

Figure 13:
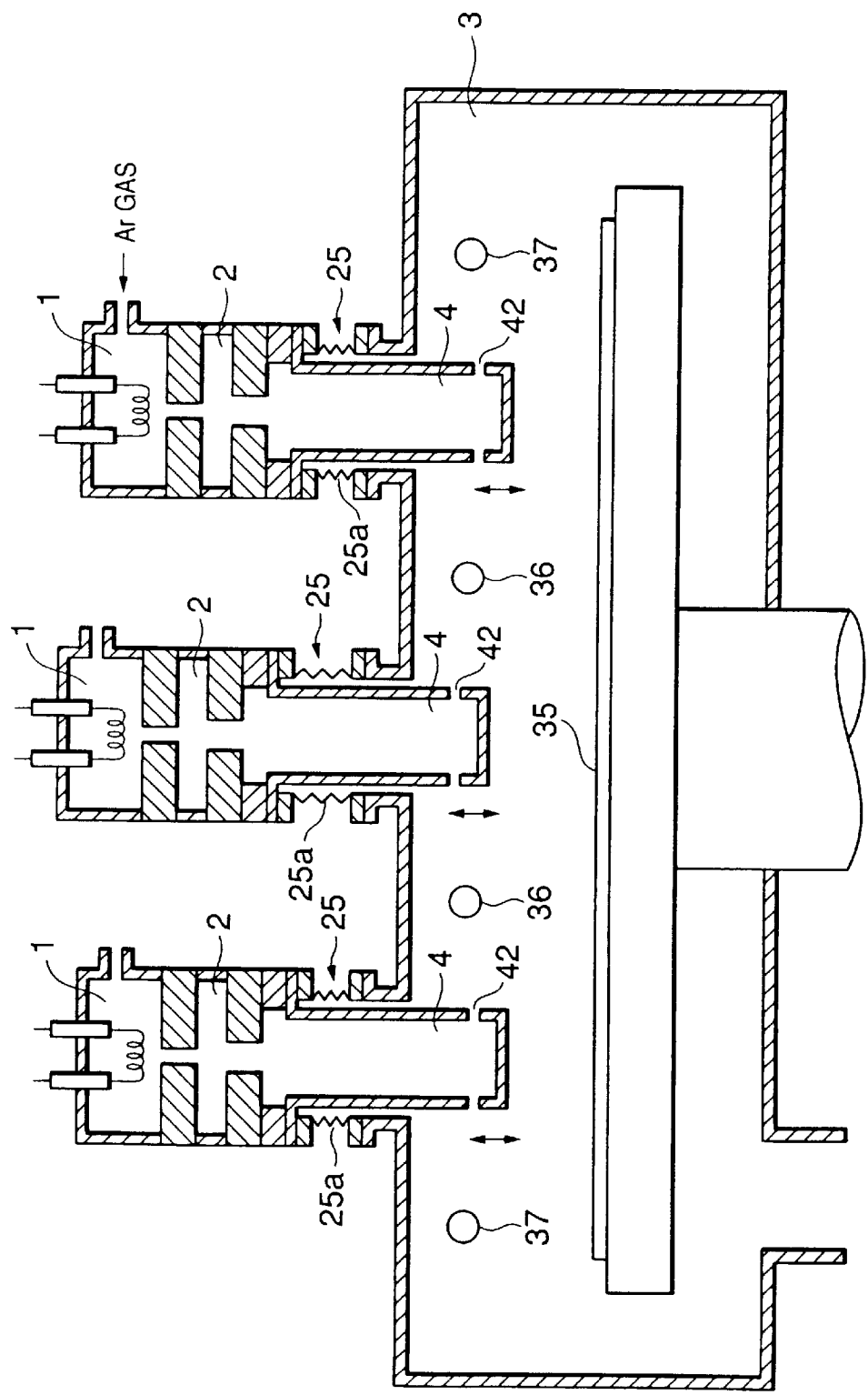
FIG. 13 is a sectional view showing an electron-beam excited plasma processing equipment according to a fourth embodiment of the present invention.

FIG. 13 is a sectional view showing an electron-beam excited plasma processing equipment according to a fourth embodiment of the present invention.

In the electron-beam excited plasma processing equipment according to the fourth embodiment, uniformity of the process plasma is controlled on the surface of the object 35 by adjusting relative height relationships between the extracting orifices 42 and the accelerating electrodes 36, 37.

Fitting nozzles 25 are provided between the discharge chambers 2 and the process chamber 3, respectively. Such fitting nozzles 25 can be expanded and contracted while keeping airtightness by vacuum bellows 25a, respectively. Therefore, the height of the extracting orifices 42 of the compartments 4 extended below the discharge chambers 2 can be adjusted. Each compartment 4 has an appropriate length such that the extracting orifices 42 can be exposed in the process chamber 3. The plasma density distribution in the process chamber 3 can be adjusted by changing respective heights of the extracting orifices 42.

[Embodiment 5]

Figure 14:
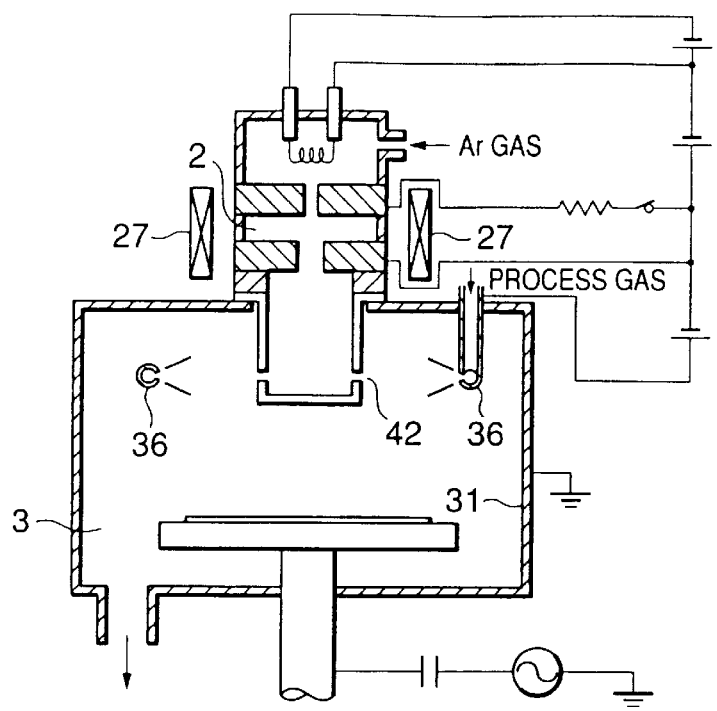
FIG. 14 is a sectional view showing an electron-beam excited plasma processing equipment according to a fifth embodiment of the present invention.

FIG. 14 is a sectional view showing an electron-bea excited plasma processing equipment according to a fifth embodiment of the present invention.

In the electron-beam excited plasma processing equipment according to the fifth embodiment, the accelerating electrode 36 is also used as a process gas introducing port. Since the excited plasma has the highest density between the orifices 42 and the accelerating electrode 36, a decomposition efficiency of the process gas can be improved by supplying the process gas from the accelerating electrode 36 toward the high density excited plasma. Also, since the accelerating electrode 36 is heated by the input accelerating current up to the high temperature, the process gas is thermally decomposed when the process gas is passed through the high temperature portion of the accelerating electrode 36. As a result, the equipment according to the fifth embodiment has an advantage to improve a total decomposition efficiency in view of an amount of such thermally decomposed process gas.

Also, since the gas pressure becomes high in the vicinity of the process gas introducing port of the accelerating electrode 36, a convergence effect of the plasma onto the accelerating electrode 36 can be increased and also an effect of reducing the plasma interference on the inner wall 31 defining the process chamber 3 can be attained.

In this manner, in the electron-beam excited plasma processing equipment according to the fifth embodiment, the film forming rate in the film forming process can be improved, and also a running cost can be reduced because of a small amount of gas.

The accelerating electrode 36 is formed of heat resisting material such as tungsten, etc. because it is heated up to the high temperature. A permanent magnet 27 provided on the outside of the discharge chamber 2 has such a function of concentrating the magnetic flux to an axis of the openings of the intermediate electrode 13 and the discharge electrode 23 such that the electron flow can pass easily through the openings.

[Embodiment 6]

FIGS. 15 to 25 are views showing an electron-beam excited plasma processing equipment according to a sixth embodiment of the present invention.

The sixth embodiment is different from the first embodiment in that several air-core coils are added. The magnetic field which has a weak portion of the magnetic field strength on a plane along which the electrons are extracted from the extracting orifices can be formed. Therefore, a ionizing efficiency can be improved by extending an electron existing time to achieve the high density plasma.

Figure 15:
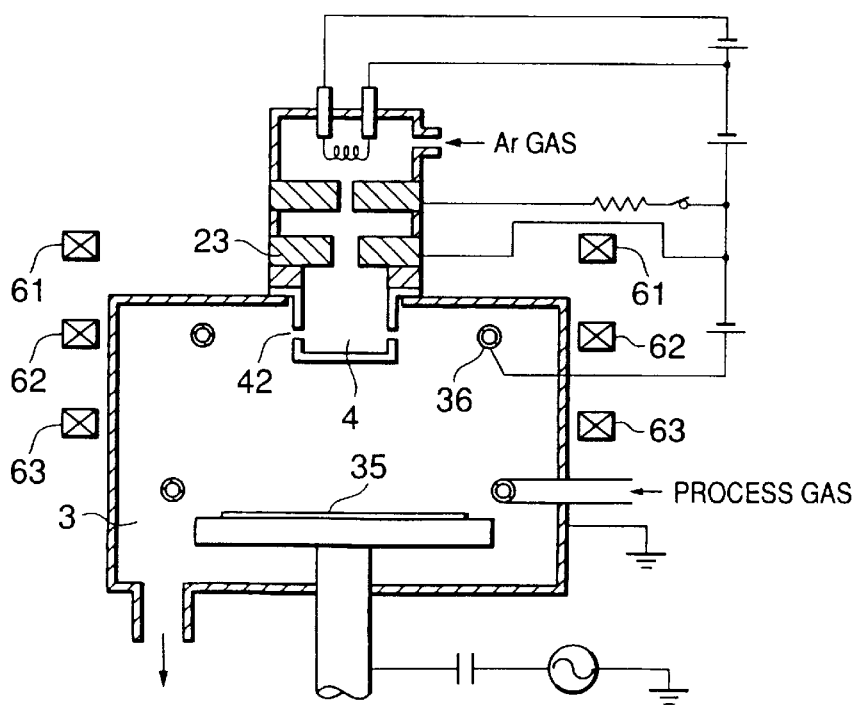
FIG. 15 is a sectional view showing an electron-beam excited plasma processing equipment using three air-core coils according to a sixth embodiment of the present invention.

FIG. 15 is a sectional view showing schematically the situation in which three air-core coils 61, 62, 63 are provided outside the process chamber 3. The first air-core coil 61 is provided at a height of the discharge electrode 23, and the second air-core coil 62 is provided on a flat plane which contains the extracting orifices 42. The third air-core coil 63 is arranged at a position, which is symmetrical to the first air-core coil 61, to put the second air-core coil 62 between them. The current is supplied to the first air-core coil 61 and the third air-core coil 63 to generate the magnetic field in the same direction, but the current is supplied to the second air-core coil 62 to generate the magnetic field in the opposite direction.

Figure 16:
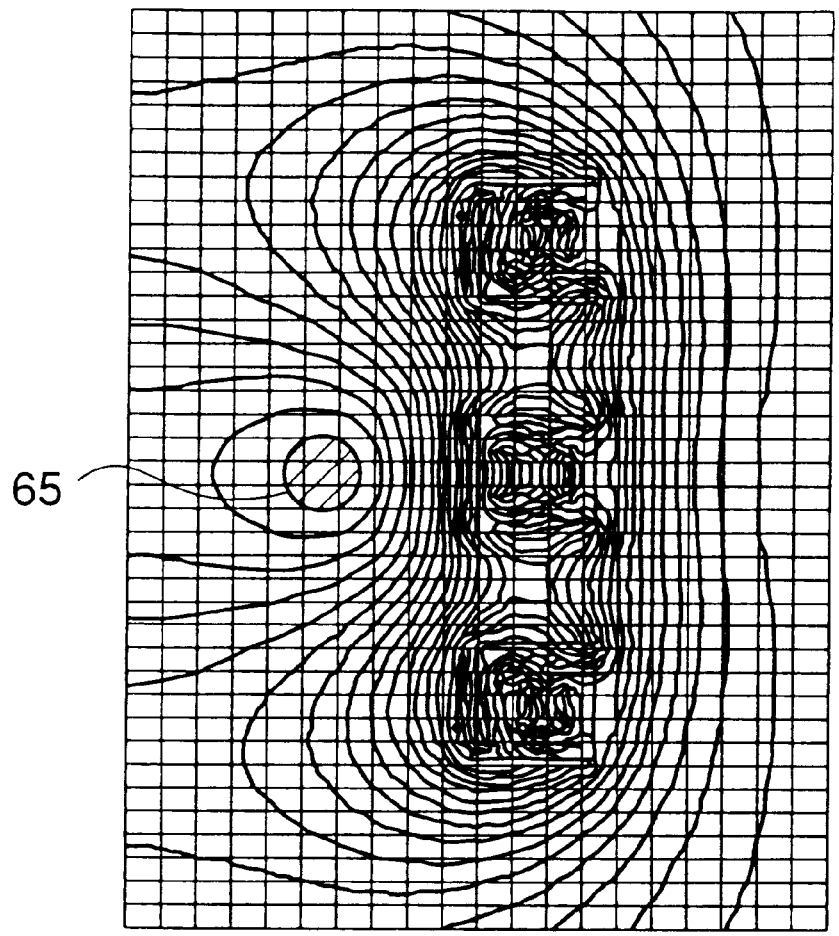
FIG. 16 is a chart showing a magnetic flux density distribution on a plane, which is parallel with an object face, under the first condition in the coil arrangement shown in FIG. 15.

FIG. 16 is a chart showing a magnetic flux density distribution generated when three air-core coils 61, 62, 63 are arranged as mentioned above. FIG. 16 shows the magnetic flux density on a vertical section along the coil axes by equi-magnetic-flux-density lines when a ratio of exciting forces (ampere•turn) of the first coil 61, the second coil 62, and the third coil 63 is set to 100:−100:100. A coil center axis is depicted on the left end of FIG. 16.

It can be understood that the weakest region 65 of the magnetic field strength is formed at a height of the second air-core coil 62 at the inside of the coils. This weakest region 65 of the magnetic field strength is a ring-like region which exists on a plane, which is parallel with the object face and contains the extracting orifices 42.

Figure 17:
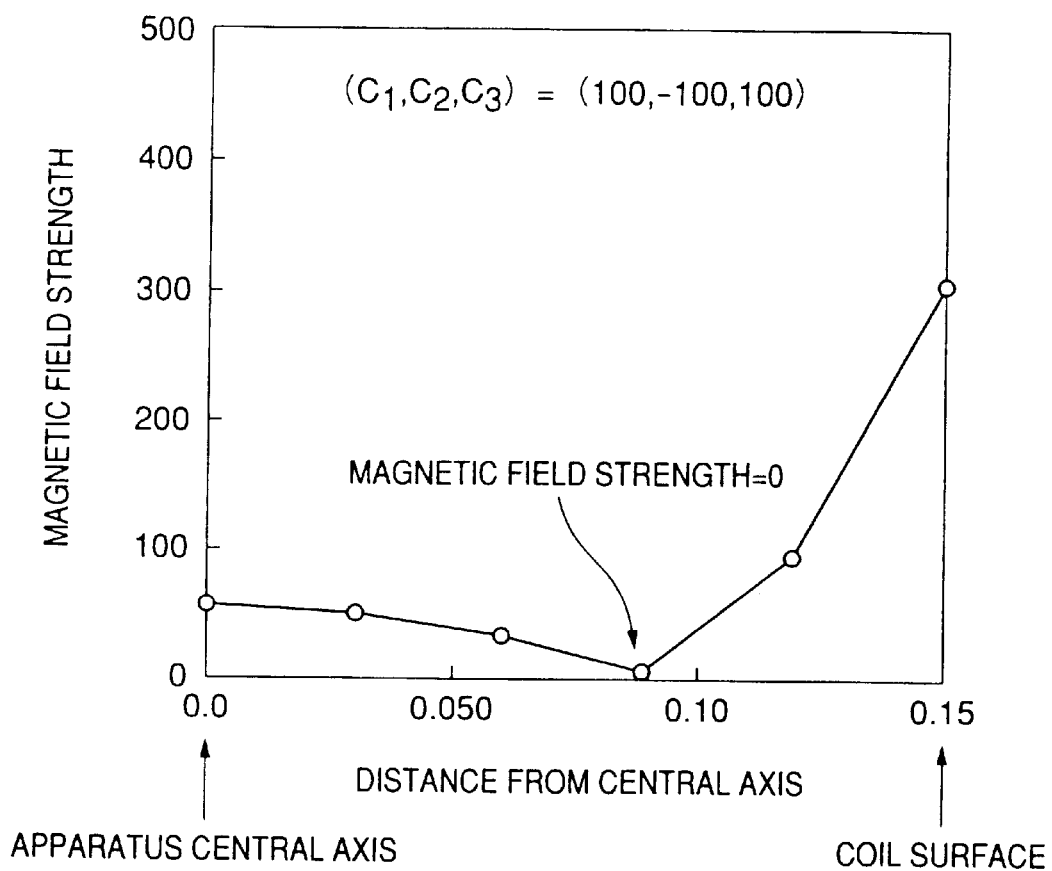
FIG. 17 is a graph showing profile in the magnetic field strength obtained under the condition shown in FIG. 16.

FIG. 17 is a graph showing profile in the magnetic field strength, which shows the magnetic field strength on a flat plane which is parallel with the object face and contains the extracting orifices 42, based on FIG. 16. In the graph of FIG. 17, a left end point on an abscissa denotes a center axis position of the copartment 4 and a right end point on the abscissa denotes a position of the second air-core coil 62, and an ordinate denotes a relative strength of the magnetic flux density.

It can be understood that a position there the magnetic flux density becomes zero is produced between the compartment 4 and the second coil 62 under the above condition. The accelerating electrode 36 is arranged at the outside of the low magnetic flux density area.

Since the electrons which are extracted from the extracting orifices 42 and accelerated are confined in the zero magnetic field strength region, a probability that molecules of the process gas are ionized/dissociated by the electrons can be enhanced to thus generate the high density plasma. In addition, since the magnetic flux density is high in the neighborhood of a wall 31 defining the process chamber 3, the mutual action between the wall material and the plasma can be reduced.

Further, if a low magnetic flux density region 65 is set between the accelerating electrode 36 and the extracting orifices 42, the convergence of the plasma can be improved. For this reason, the interference of the process plasma with the wall 31 defining the process chamber 3 can be reduced, and thus emission of the impurity from the wall 31 can be reduced. Therefore, an amount of the impurity which is injected into the film can be reduced and thus the high quality film can be formed.

Furthermore, the density of the charged particles can be reduced in the vicinity of the object, so that the electron temperature can be reduced significantly. Therefore, the energy and the density of ions which collide with the object surface can be reduced to contribute toward the higher quality of the film.

Since the neutral activated species can reach the object surface irrespective of the magnetic flux density, high speed film formation can be implemented.

In this case, the region in which the magnetic field strength is minimized can be changed by adjusting the current supplied to the coils even if the coil arrangement is the same.

Figure 18:
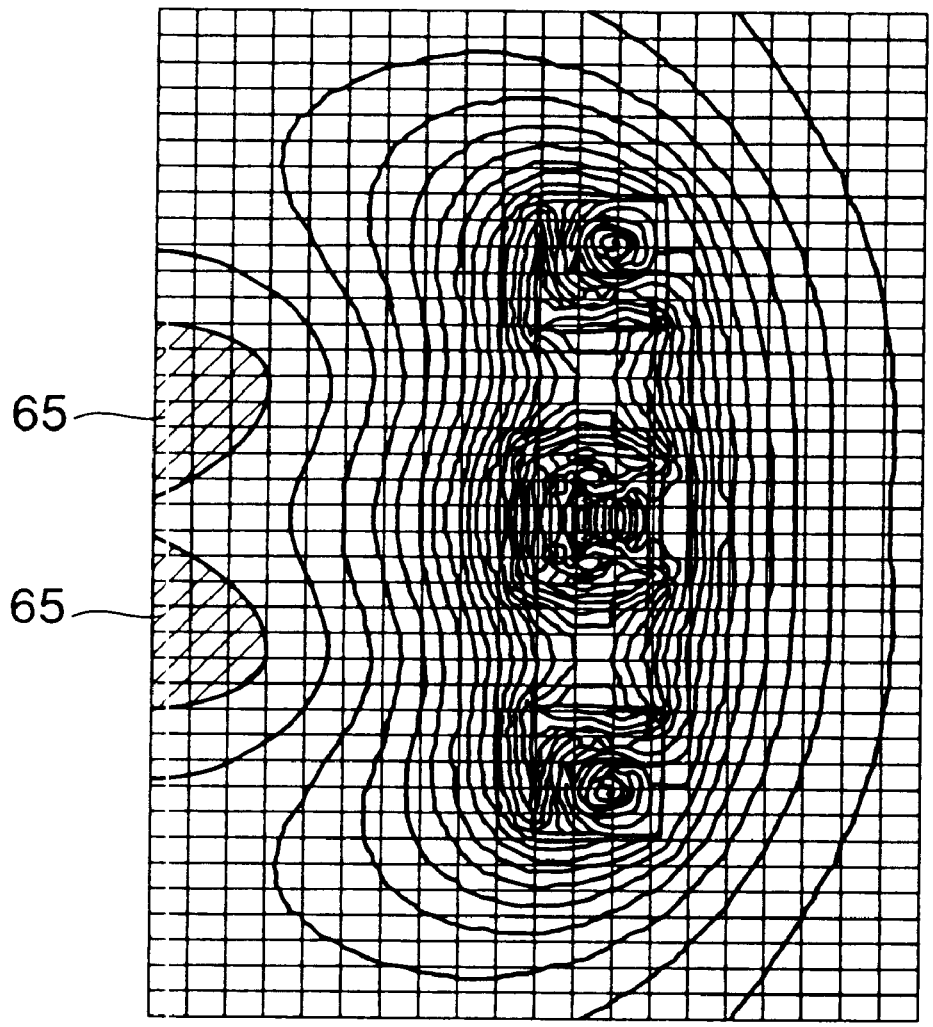
FIG. 18 is a chart showing a magnetic flux density distribution on the plane under the second condition in the coil arrangement shown in FIG. 15.
Figure 19:
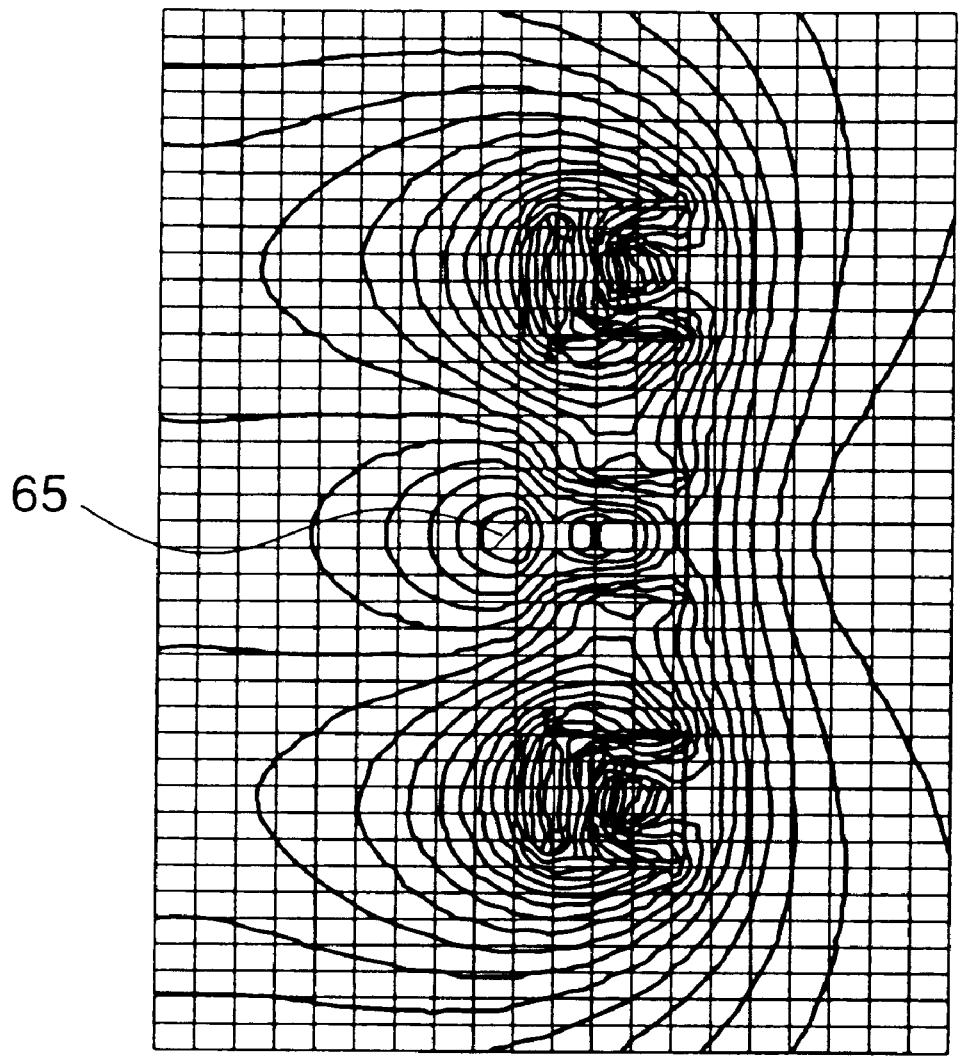
FIG. 19 is a chart showing a magnetic flux density distribution on the surface under the third condition in the coil arrangement shown in FIG. 15.

FIG. 18 is a chart showing a magnetic flux density distribution obtained when a ratio of exciting forces of the first coil 61, the second coil 62, and the third coil 63 is set to 100:−150:100. FIG. 19 is a chart showing a magnetic flux density distribution obtained when a ratio of exciting forces of the first coil 61, the second coil 62, and the third coil 63 is set to 100–50:100. The low magnetic flux density region 65 goes away from coil surfaces when the current value of the second coil 62 is increased, while the low magnetic flux density region 65 comes close to the coil surfaces when the current value of the second coil 62 is decreased.

Therefore, an electron stagnation region can be formed at an appropriate position by adjusting the coil current, so that the ionizing efficiency can be adjusted. For this reason, large area uniformizing process can be accomplished by controlling the plasma density distribution on the object surface.

Figure 20:
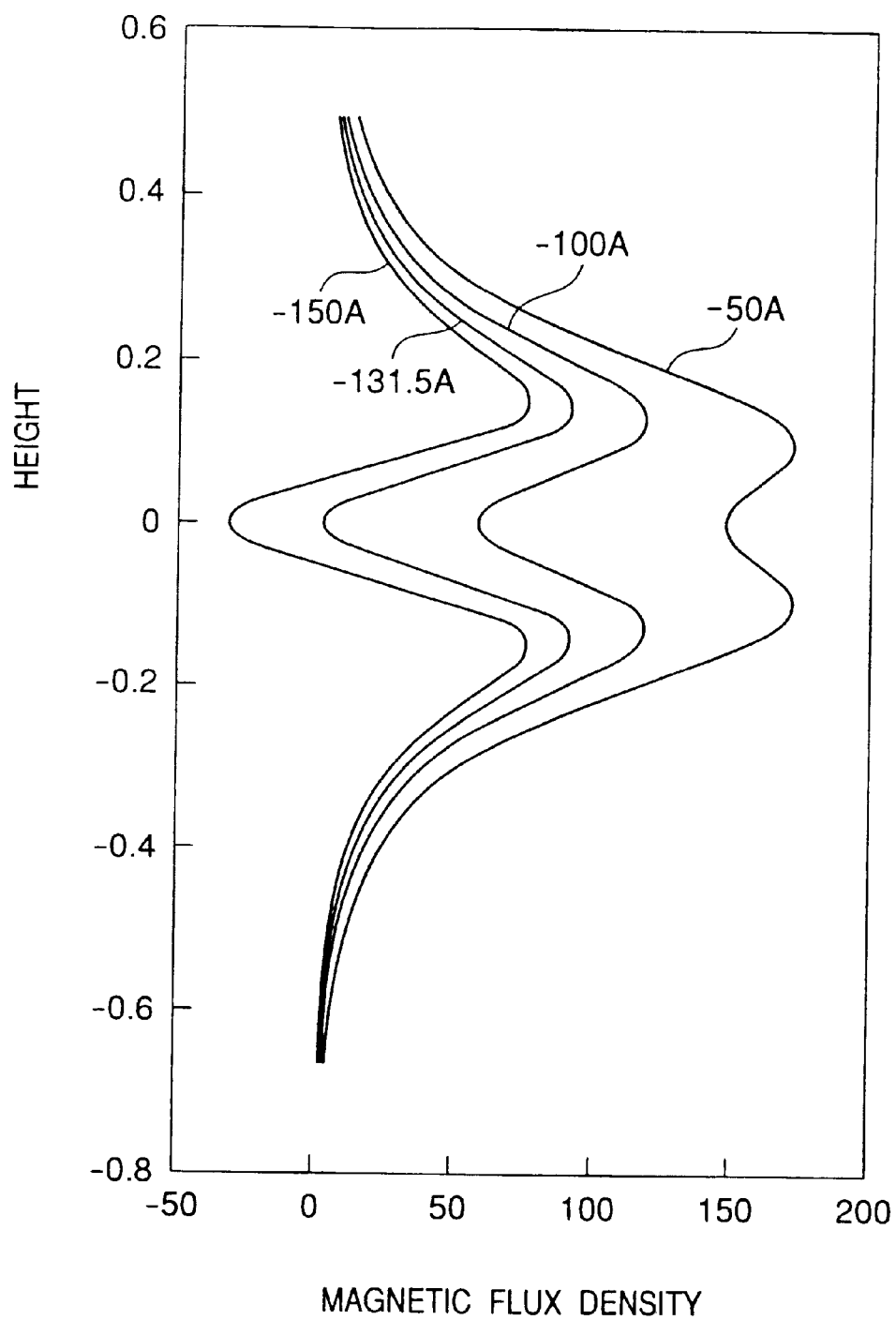
FIG. 20 is a graph showing profile in the magnetic flux density on a center axis of the coil in the coil arrangement shown in FIG. 15.

FIG. 20 is a graph showing profile in the magnetic flux density on a center axis of the coil in the coil arrangement shown in FIG. 16.

An ordinate denotes a position on a center axis when a height of the extracting orifices 42 is set to zero, and an abscissa denotes the magnetic flux density on that position. With holding the currents supplied to the first coil 61 and the third coil 63 constant, values of the opposite current supplied to the second coil 62 are depicted as parameters.

The magnetic flux density has a maximum value near the discharge electrode 23, and has a minimal value at the height of the extracting orifices 42. The magnetic flux density generated below the extracting orifices 42 changes symmetrically with that generated over the extracting orifices 42. Because the magnetic flux density at a position of the discharge electrode 23 is high, extraction of the electron beam from the discharge chamber 2 can be made easy.

In addition, if the exciting force of the second coil 62 is optimized, the magnetic field strength at a center of the compartment 4 or the position of the extracting orifices 42 can be reduced to zero. Therefore, extraction through the orifices 42 and acceleration of the electrons can be carried out easily and thus the stable operation can be achieved by the low accelerating voltage.

Figure 21:
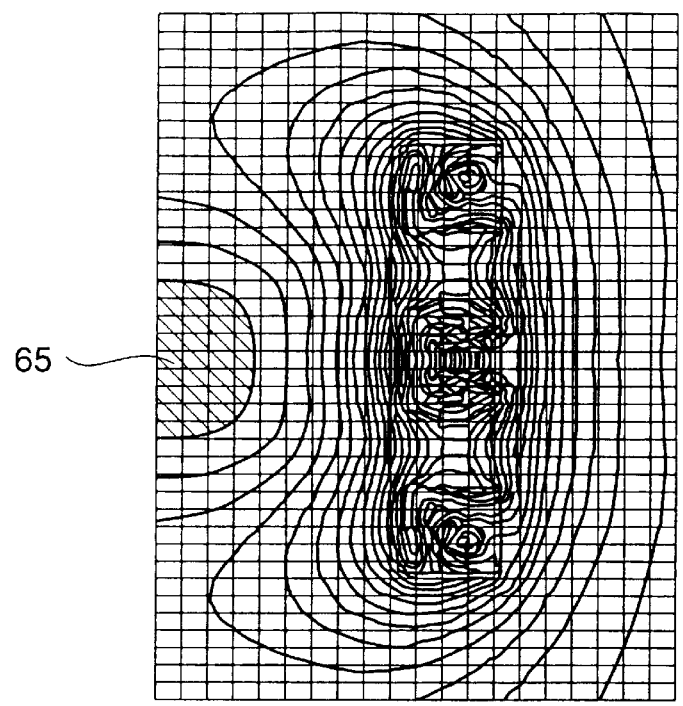
FIG. 21 is a chart showing a magnetic flux density distribution under the optimal condition in the coil arrangement shown in FIG. 15.
Figure 22:
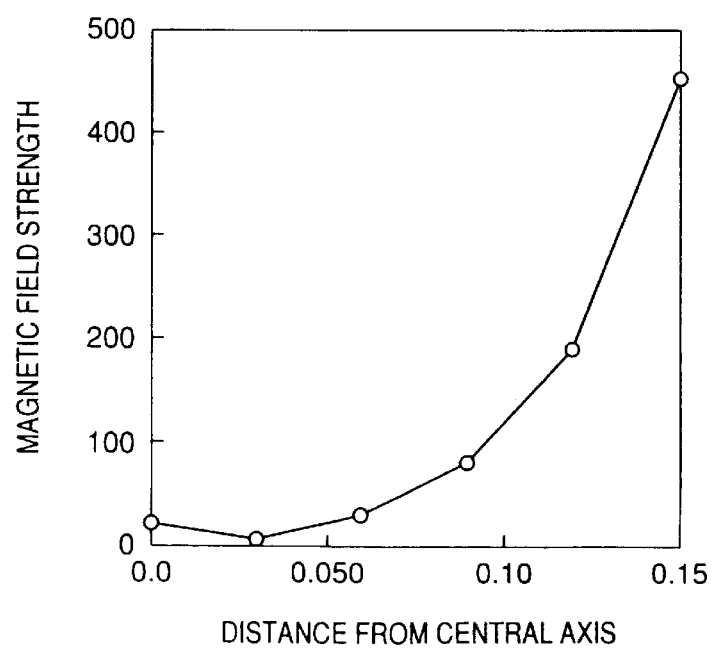
FIG. 22 is a graph showing profile in the magnetic field strength obtained under the condition shown in FIG. 21.

FIG. 21 is a chart showing a magnetic flux density distribution obtained when the low magnetic flux density region 65 is formed on a portion of the copartment 4. FIG. 22 is a graph showing profile in the magnetic field strength on a flat plane which is parallel with the object surface 35 and contains the extracting orifices 42.

The magnetic field strength at the position of the extracting orifices 42 can be most reduced. An extraction through the orifices 42 and acceleration of the electrons can be carried out easily and thus the stable operation can be achieved by the low accelerating voltage.

If the exciting force of the second coil 62 is canceled and the exciting forces of the first coil 61 and the third coil 63 have the same values but have difference signs, the magnetic field strength on the flat plane to which the second coil 62 belongs becomes zero. Therefore, an advantage of extending the stagnation time of the electron beam can be achieved. The above situation can also be produced by using two air-core coils without providing the second coil from the beginning.

Figure 23:
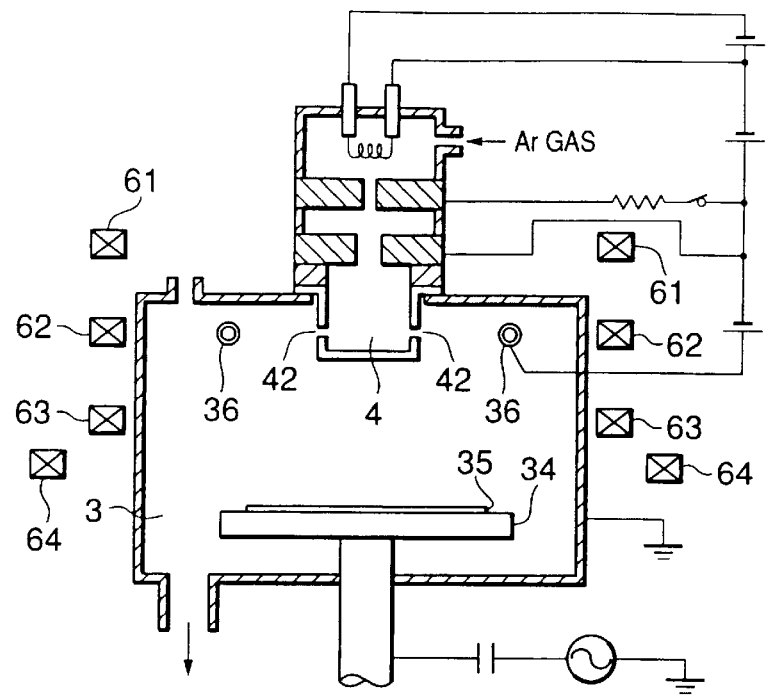
FIG. 23 is a sectional view showing an example using four air-core coils in the equipment according to the sixth embodiment of the present invention.
Figure 24:
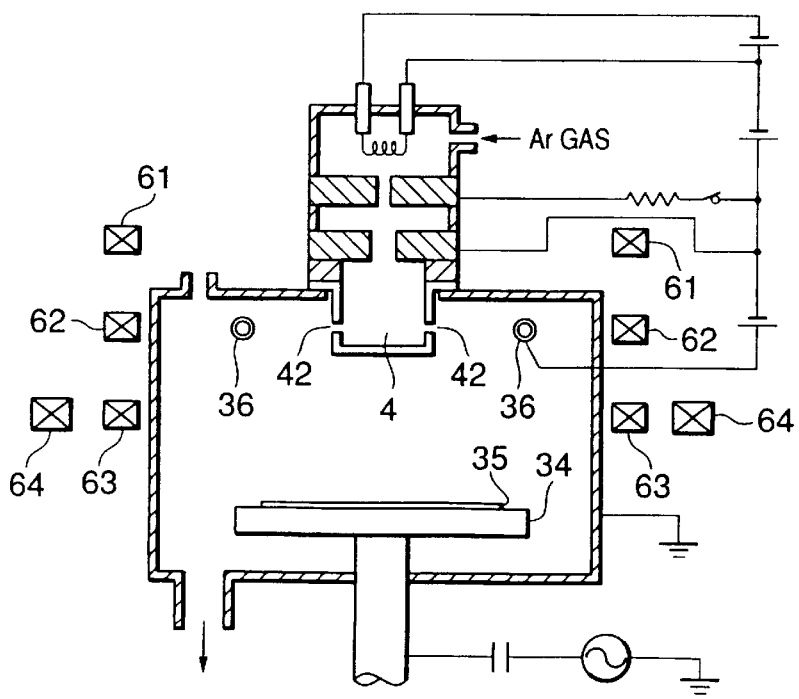
FIG. 24 is a sectional view showing another example using four air-core coils in the equipment according to the sixth embodiment of the present invention.

FIGS. 23 and 24 are sectional views showing examples in which the fourth air-core coil is further provided. Since the magnetic field which is formed by the third coil can be canceled by the fourth coil, the magnetic flux density in the vicinity of the object can be reduced to then expand the plasma suddenly and as a result the uniform process plasma can be obtained.

FIG. 23 shows the case where the fourth coil 64 is provided between the third coil 63 and the object table 34. FIG. 24 shows the case where the third and fourth coils 63, 64 are provided as a double coil and the fourth coil 64 is formed of an outer coil of the double coil.

Figure 25:
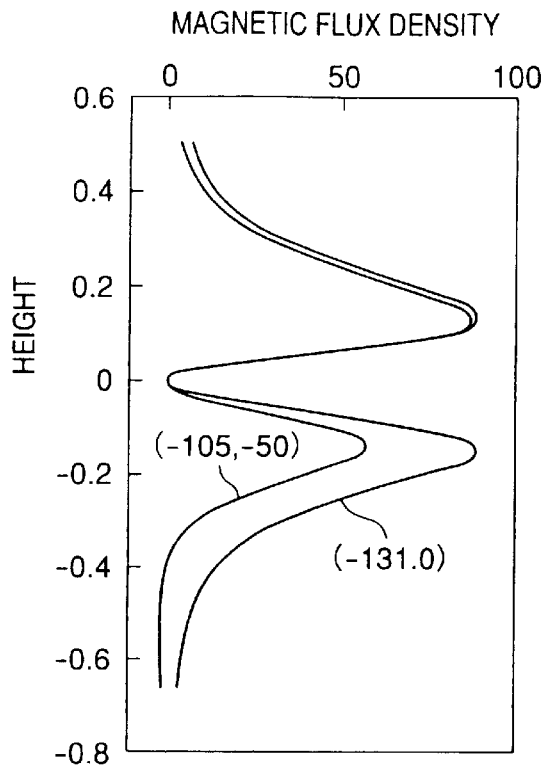
FIG. 25 is a graph showing profile in the magnetic flux density to explain an advantage attained when four air-core coils are employed in the equipment according to the sixth embodiment of the present invention.

FIG. 25 is a graph showing profile in the magnetic flux density to explain an advantage attained when the fourth coil 64 is added. If it is assume that the exciting forces of the first coil 61 and the third coil 63 are set to 100 and the exciting force of the second coil 62 is set to −131, the magnetic flux density near the extracting orifices 42 can be reduced to almost zero, but the magnetic flux density below the extracting orifices 42 is high. If the exciting force of the second coil 62 is set to −105 and the exciting force of the fourth coil 64 is set to −50, the magnetic flux density over the extracting orifices 42 are seldom changed, but the magnetic flux density below the extracting orifices 42 can be reduced. As a result, the magnetic flux density on the surface of the object 35 can be sufficiently lowered, so that the object 35 can be subjected to the uniform plasma processing.

[Embodiment 7]

Figure 26:
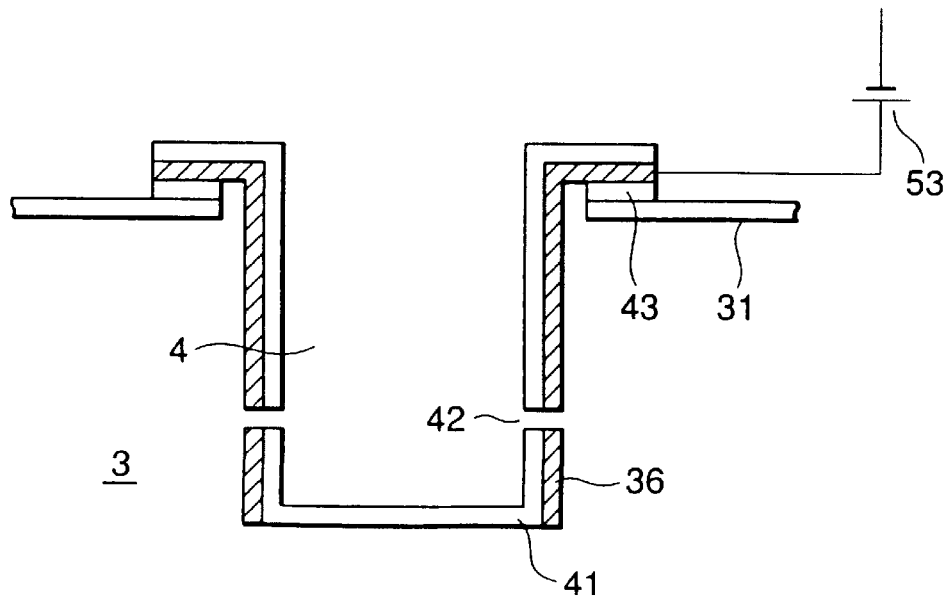
FIG. 26 is an enlarged fragmentary sectional view showing an electron-beam excited plasma processing equipment according to a seventh embodiment of the present invention.
Figures 27A, 27B, 27C:
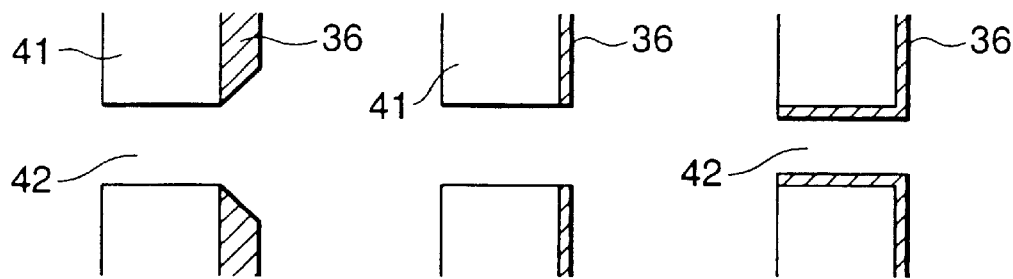
FIGS. 27a to 27c are enlarged fragmentary sectional views showing various modes of the accelerating electrode in the equipment according to the seventh embodiment of the present invention, respectively.
Figure 28:
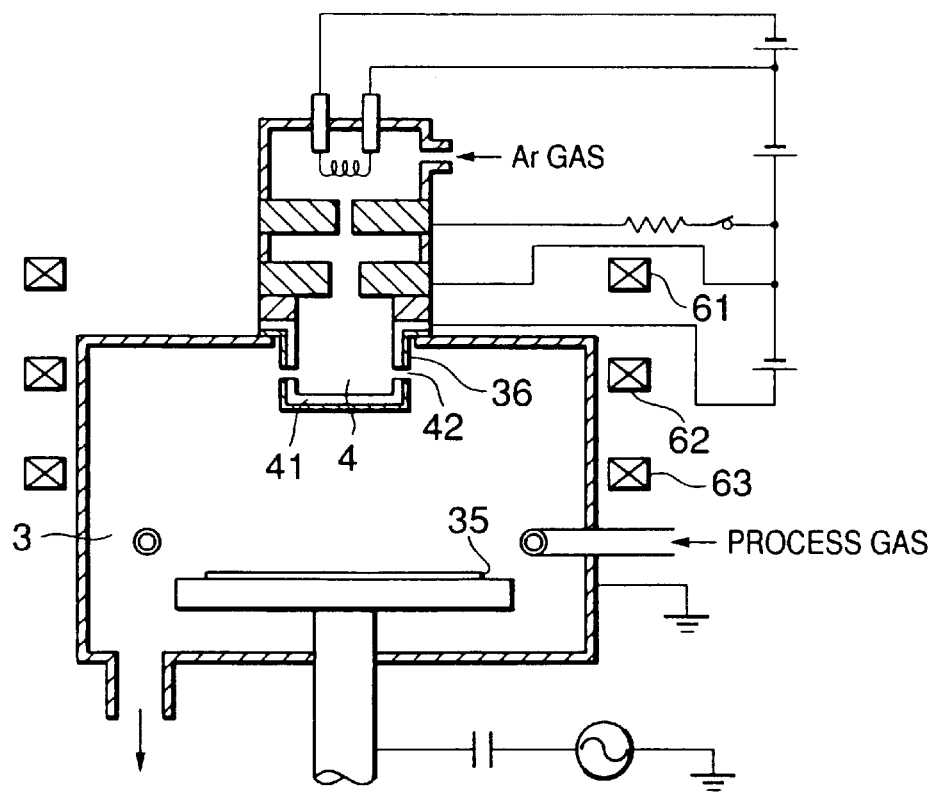
FIG. 28 is a sectional view showing the situation where an accelerating electrode in the seventh embodiment of the present invention is applied to the equipment shown in FIG. 15.

FIGS. 26 to 28 are views showing an embodiment in which the accelerating electrode is arranged adjacent to the extracting orifice in the process chamber.

FIG. 26 is an enlarged fragmentary sectional view showing an electron-beam excited plasma processing equipment according to a seventh embodiment of the present invention.

An accelerating electrode 36 is formed on the outer periphery of the partition 41 of the compartment 4. Since the extracting orifices 42 are formed by boring holes through both the partition 41 and the accelerating electrode 36, the accelerating electrode 36 can be positioned adjacent to the extracting orifices 42. The accelerating electrode 36 is connected to the accelerating power supply 53, but is electrically insulated from a peripheral wall 31 defining the process chamber 3 via an insulating material 43.

In the electron-beam excited plasma processing equipment according to the seventh embodiment, the accelerating electrode 36 is not suspended independently in the process chamber 3 but formed integrally with the compartment 4. Therefore, assembling, positioning, and maintenance of the equipment can be made simple.

FIGS. 27a to 27c are enlarged sectional views showing other modes of the extracting orifices 42 when the accelerating electrode 36 is formed on the partition 41.

In the extracting orifice 42 shown in FIG. 27a, the accelerating electrode 36 is chamfered at an edge of the extracting orifice 42 to form a conical shape. Therefore, the electron beam emitted from the extracting orifice 42 does not collide with the extracting orifice 42 when such electron beam returns to flow into the accelerating electrode 36. As a result, the extracting orifice 42 is hard to be damaged.

In the extracting orifice 42 shown in FIG. 27b, a thin film being deposited on an outer periphery of the insulating partition 41 is utilized as the accelerating electrode 36. As a result, this extracting orifice 42 is ready in fabrication.

In the extracting orifice 42 shown in FIG. 27c, a thin film is further formed to cover an inner wall of the extracting orifice 42. This extracting orifice 42 has such an advantage that the acceleration can be caused smoothly since the electric field, which is generated by the accelerating voltage applied to the accelerating electrode 36, can easily act onto the discharge plasma.

The electron-beam excited plasma processing equipment according to the seventh embodiment can be utilized in combination with the equipments according to above-mentioned embodiments.

FIG. 28 is a sectional view showing the situation where the accelerating electrode is provided adjacent to the extracting orifice in the electron-beam excited plasma processing equipment having the magnetic filed applying mechanism, as shown in FIG. 15.

The accelerating electrode 36 is formed on an outer periphery of the partition 41 extremely close to the extracting orifices 42. Three air-core coils 61, 62, 63 are provided at the outside of the process chamber 3.

The electrons are extracted from the plasma filled in the compartment 4 via the extracting orifices 42, then discharged into the process chamber 3, then existed sufficiently in a space which has the smallest magnetic field to contribute toward ionization/dissociation, and then flow into the accelerating electrode 36. A transit orbit of the electron can be changed in compliance with the distribution of the magnetic field which is formed by the air-core coils 61, 62, 63. Since the distribution of the magnetic field can be easily changed by changing the current value of the second coil 62 particularly, uniformity of the plasma density can be improved on the object surface by adjusting a length and a shape of the process plasma extended from the extracting orifices 42.

In addition, a deposition rate can also be changed in accordance with a time pattern by varying the coil current during the film forming step.

Although all of the above-mentioned embodiments 1–7 have the discharge electrode which in disposed between the discharge chamber and the compartment, the discharge electrode can be disposed in the compartment with the same effects obtained by the embodiments 1–7.

[Embodiment 8]

FIGS. 29 to 33 are sectional views showing an electron-beam excited plasma processing equipment according to an eighth embodiment of the present invention.

The electron-beam excited plasma processing equipment according to the eighth embodiment has such a feature that the discharge plasma can be generated by the microwave or the high frequency discharge in place of the direct current discharge.

Figure 29:
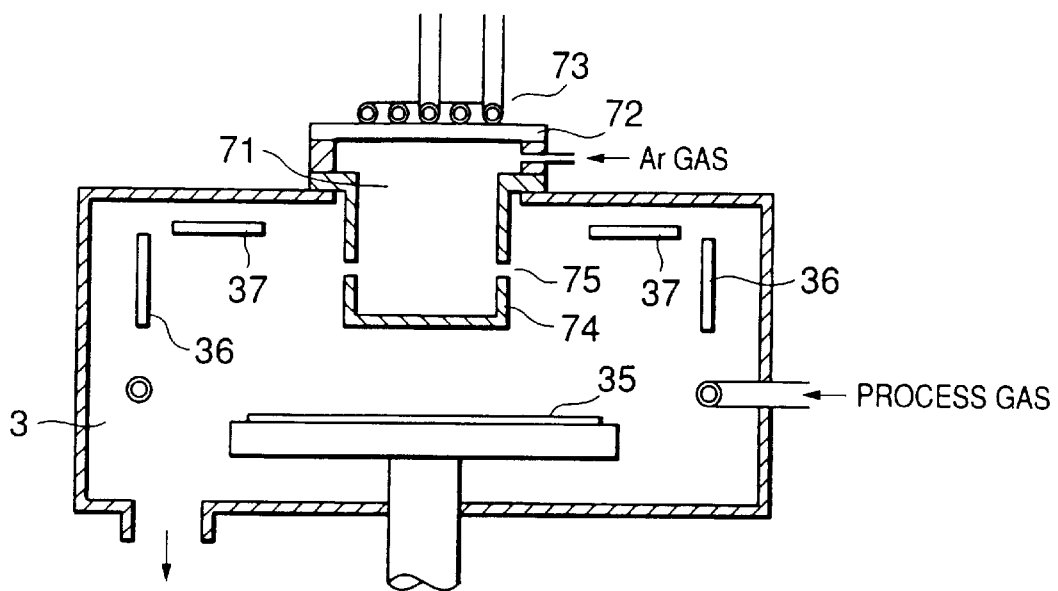
FIG. 29 is an enlarged fragmentary sectional view showing an electron-beam excited plasma processing equipment according to an eighth embodiment of the present invention.

In a mode shown in FIG. 29, so-called inductively coupled high frequency plasma discharging system is employed. In other words, a dielectric plate 72 formed of dielectric material such as quartz is provided on a discharge portion 71, and then a high frequency (RF) spiral coil 73 is loaded on the dielectric plate 72.

The high frequency current of 13.56 MHz, for example, is supplied from a high frequency power supply (not shown) to the RF coil 73 to ionize the discharge gas such as an argon gas supplied to the discharge portion 71. A cooling water can be passed through a cavity of the RF coil 73. The discharge portion 71 is used commonly as the copartment in respective embodiments, and extracting orifices 75 are formed through the partition 74 which separates the compartment from the process chamber 3.

The first accelerating electrode 36 and the second accelerating electrode 37 are arranged in the process chamber 3. The first accelerating electrode 36 and the second accelerating electrode 37 accelerate the electron beam, which is extracted from the discharge plasma generated in the discharge portion 71 by the high frequency discharge into the process chamber 3 via the extracting orifices 75, to ionize the process gas supplied to the process chamber 3. Thus, the object surface 35 is processed by the plasma.

Figures 30A, 30B:
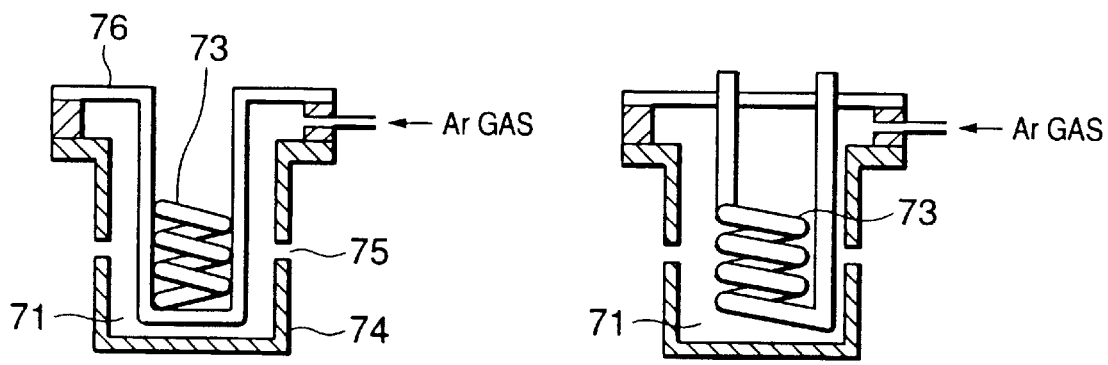
FIGS. 30a and 30b are sectional views showing various modes of RF coils in the equipment according to the eighth embodiment of the present invention respectively.

FIGS. 30a and 30b are sectional views showing various modes of the RF coils.

FIG. 30a shows the case where a dielectric cylindrical body 76 is provided to protrude into a discharge chamber 71 and then an RF coil 73 is provided in the cylindrical body 76. Thus, the high density discharge plasma can be generated around the extracting orifices 74.

FIG. 30b shows the case where the RF coil 73 is directly inserted into the discharge chamber 71 without the intervention of the wall of the dielectric substance. The RF coil 73 is damaged by the impact of the ions in the plasma, but loss of the power can be reduced. In this case, the dielectric material may be coated on a surface of the RF coil 73 to suppress the loss of the RF coil 73.

Figure 31:
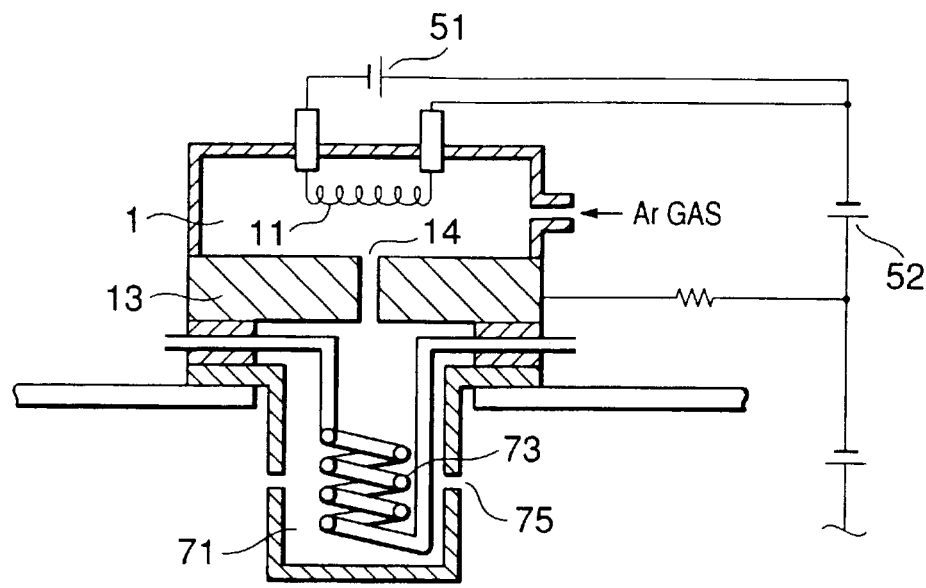
FIG. 31 is a sectional view showing another mode of a plasma generating portion in the equipment according to the eighth embodiment of the present invention.

FIG. 31 shows the equipment for ionizing the Argon gas by the RF coil 73 with supplying the thermions, which are generated in the cathode chamber 1, into the discharge chamber 71. When the electrons are extracted from the discharge plasma generated by the RF coil 73, the ions in the discharge plasma collide with the RF coil 73 to emit secondary electrons and to supply the electrons. As a result, wear of the coil surface is unavoidable. This equipment shown in FIG. 31 intends to prevent the wear of the RF coil 73 by supplying separately the electrons.

The cathode chamber 1 is provided over the discharge chamber 71 shown in FIG. 30b via an auxiliary electrode or the intermediate electrode 13. A filament 11 provided in the cathode chamber 1 is heated by the electric current supplied from the heating power supply 51 to emit the thermions. Since the thermions are supplied to the discharge chamber 71 via a through hole 14 of the auxiliary electrode 13 connected to the discharge power supply 52 to supplement the electrons extracted from the extracting orifices 75, the ions in the discharge plasma never sputters the surface of the RF coil 73. Therefore, such an advantage can be attained that a lifetime of the RF coil 73 can be extended.

In this case, the above-mentioned method of generating the discharge plasma by the microwave or the high frequency plasma and the above-mentioned method of supplying the thermions to the generated discharge plasma can be applied irrespective to the number of the accelerating electrodes.

Figure 32:
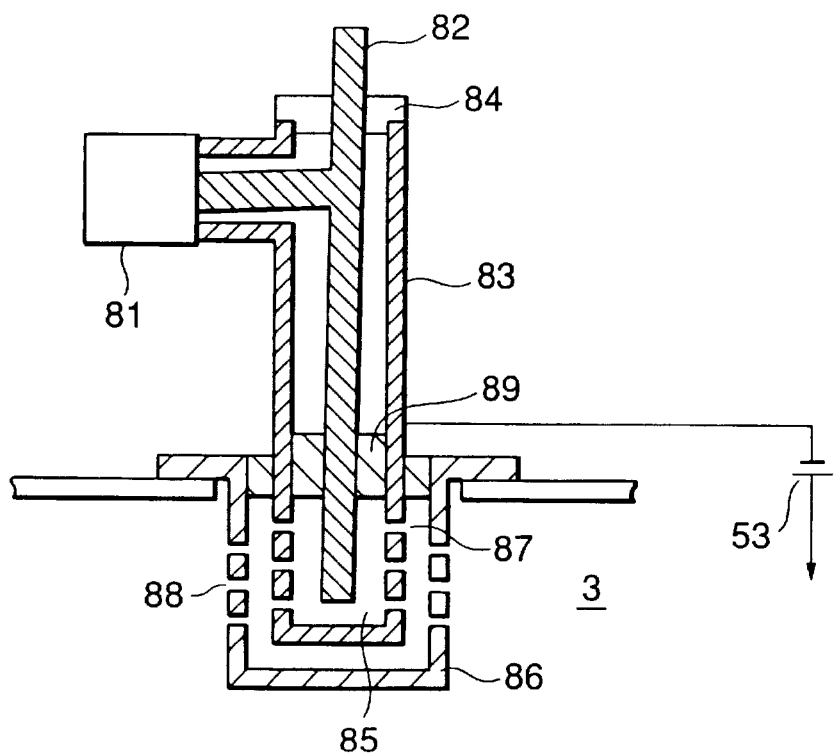
FIG. 32 is an enlarged fragmentary sectional view showing a mode to obtain the plasma by the microwave on the coaxial line in the equipment according to the eighth embodiment of the present invention.
Figure 33:
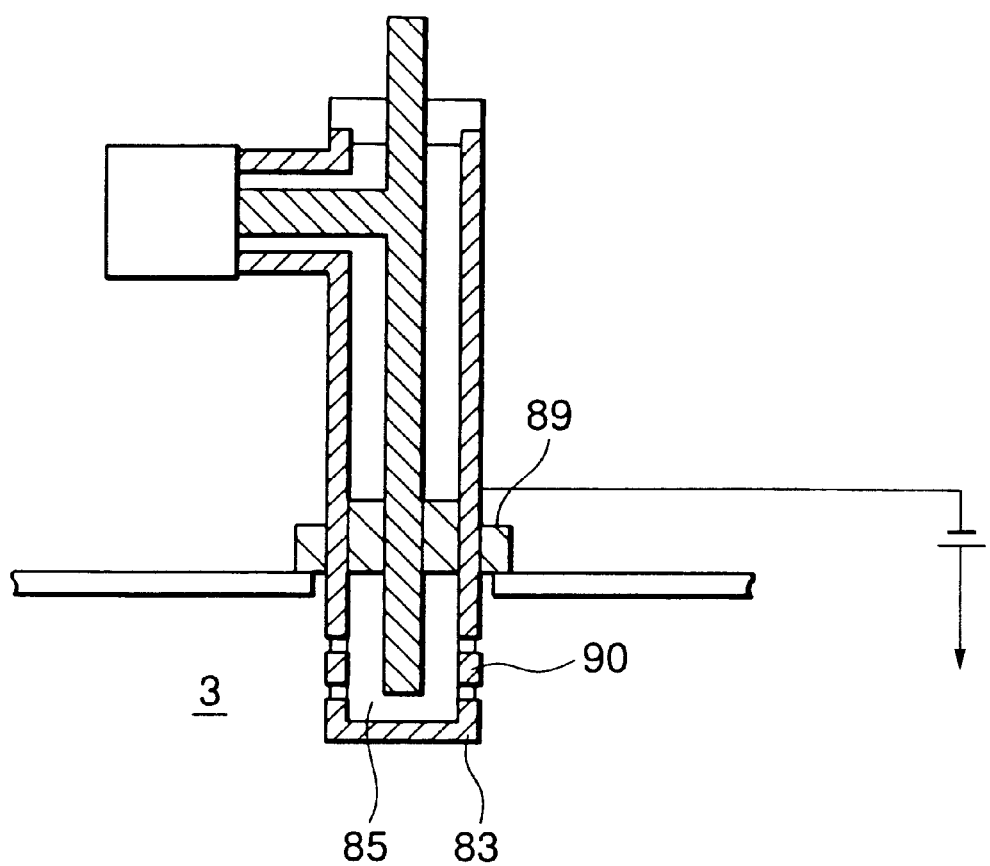
FIG. 33 is an enlarged fragmentary sectional view showing another mode by using the coaxial line in the equipment according to the eighth embodiment of the present invention.

FIGS. 32 and 33 show examples in which the electrons are extracted from the discharge plasma generated by the microwave via the orifices.

In the electron-beam excited plasma processing equipment shown in FIG. 32, a microwave source 81 such as a magnetron is coupled to a coaxial cable which consists of a center conductor 82 and an outer conductor 83. The outer terminal of the coaxial cable acts as a terminal which is magnetically fixed by a short-circuit ring which short-circuits electrically the center conductor 82 and the outer conductor 83, while the other terminal of the coaxial cable is fitted in the process chamber 3 to form a discharge chamber 85. A partition 86 made of insulating material is provided at the outside of the discharge chamber 85. orifices 87 provided through the wall of the discharge chamber 85 and extracting orifices 88 provided through the partition 86 are positioned in a zig-zag fashion.

A space between the center conductor 82 and the outer conductor 83 and a space between the outer conductor 83 and the partition 86 are supported airtightly by insulating material 89.

The microwave discharge is performed in the discharge chamber 85, which is fitted in the process chamber 3, to generate the discharge plasma. The electrons can be extracted into the process chamber 3 via the orifices 87 of the discharge chamber 85. An accelerating power supply 53 is connected between the outer conductor 83 and the accelerating electrode provided in the process chamber 3. The electrons are extracted by the applied accelerating voltage and then accelerated to ionize the process gas in the process chamber 3.

Since the orifices 87 of the discharge chamber 85 and the extracting orifices 88 are positioned in a zig-zag fashion, the ions of the plasma in the process chamber 3 never directly collide with the orifices 17. Therefore, the wear of the orifices 87 can be prevented and thus a lifetime of the equipment can be extended.

The microwave may be supplied via a waveguide, a matching device, or a coaxial cable without the direct coupling between the coaxial line and the microwave source. Also, slit-type or mesh-type orifices 87 may be provided through the outer conductor 83.

Also, the high density plasma may be produced by arranging a permanent magnet in the center conductor 82. In other words, the magnetic flux density of 875 Gauss is formed by the permanent magnet in the neighborhood of the orifices so as to resonate with the microwave of a frequency of 2.45 GHz, so that absorption of the microwave power is carried out effectively to confine the plasma near the orifices.

FIG. 33 is a sectional view showing an example in which no partition is provided at the outside of the outer conductor 83 but a surface of the outer conductor 83 on the process chamber 3 side is coated with insulating material 90 to suppress the sputter loss of the outer conductor 83 caused by the ions during the plasma process.

The coaxial cable acting as the discharge chamber 85 is fitted directly and airtightly onto the outer wall defining the process chamber 3 via insulating material 89.

Although the cathode chamber, the discharge chamber, the process chamber, and the compartment are aligned vertically in the above embodiments, they may be arranged in the horizontal direction or the inclined direction. In addition, it is needless to say that the direction of the object surface is not limited faceup but may be set facedown.

As described in detail as above, according to the electron-beam excited plasma processing equipments of the present invention, the plasma processing can be applied to the object which has a larger area and an arbitrary shape by reducing the influence of the ion impacting action, and also the object can be processed effectively by increasing the material plasma density to thus improve the uniformity of the plasma.

What is claimed is:

1. A plasma processing equipment comprising:
    a discharge vessel in which a discharge chamber for generating a discharge plasma is formed;
    a vacuum vessel in which a process chamber for generating an excited plasma by exciting a process gas by virtue of electrons which are extracted from said discharge plasma is formed;
    a partition in which a compartment is formed, said compartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma; and
    a plurality of accelerating electrodes arranged in said process chamber to extract said electrons through said orifices, wherein a number and an arrangement of said accelerating electrodes are set such that a density distribution of said excited plasma has an optimal state for processing said object.

2. A plasma processing equipment according to claim 1, further comprising an accelerating power supply for supplying a power to said accelerating electrodes, and
    wherein said accelerating electrodes are connected to an anode of said accelerating power supply via a variable resistor.

3. A plasma processing equipment according to claim 1, wherein said accelerating electrodes are aligned vertically by placing concentrically a plurality of ring electrodes which have same diameters.

4. A plasma processing equipment according to claim 1, wherein said accelerating electrodes are arranged on a same flat plane by placing concentrically a plurality of ring electrodes which have different diameters.

5. A plasma processing equipment according to claim 1, further comprising a means for moving at least one of said accelerating electrodes in a direction perpendicular to said processed surface of said object to change a relative positional relationship among said accelerating electrodes.

6. A plasma processing equipment according to claim 1, wherein a plurality of said compartments are formed, and
    said accelerating electrodes have an outer accelerating electrode and an inner accelerating electrode, and two or more of said compartments are arranged between said outer accelerating electrode and said inner accelerating electrode.

7. A plasma processing equipment according to claim 1, wherein said accelerating electrodes have an outer accelerating electrode and an inner accelerating electrode, said compartment is formed as annular shape, and said annular compartment is disposed between said outer accelerating electrode and said inner accelerating electrode.

8. A plasma processing equipment according to claim 1, further comprising a means for moving said orifices in a direction perpendicular to said processed surface of said object.

9. A plasma processing equipment according to claim 1, further comprising a gas supplying port for supplying said process gas to said process chamber, said gas supplying port being movable in a direction perpendicular to said processed surface of said object.

10. A plasma processing equipment according to claim 1, wherein said discharge plasma is generated by a direct current discharge.

11. A plasma processing equipment according to claim 1, further comprising a cathode, a discharge electrode, and an intermediate electrode arranged between them to generate said discharge plasma, wherein said discharge plasma is generated by a discharge between said cathode and said discharge electrode.

12. A plasma processing equipment according to claim 1, wherein said discharge plasma is generated by an application of a high frequency or a microwave.

13. A plasma processing equipment according to claim 1, further comprising a mechanism for supplementing said electrons to said discharge plasma.

14. A plasma processing equipment comprising:
    a discharge vessel in which a discharge chamber for generating a discharge plasma is formed;
    a vacuum vessel in which a process chamber for generating an excited plasma by exciting a process gas by virtue of electrons which are extracted from said discharge plasma is formed;
    a partition in which a compartment is formed, said copartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma;
    accelerating electrodes arranged in said process chamber to extract said electrons through said orifices; and
    a magnetic field applying mechanism for applying a magnetic field to an inside of said process chamber to generate a magnetic field strength distribution which has a region, in which a strength of said magnetic field becomes minimal, on a flat plane which is parallel with said processed surface of said object and contains said orifices.

15. A plasma processing equipment according to claim 14, wherein said magnetic field applying mechanism has a pair of air-core coils arranged symmetrically with respect to said flat plane which is parallel with said processed surface of said object and contains said orifices.

16. A plasma processing equipment according to claim 14, further comprising a discharge electrode for generating said discharge plasma, and said magnetic field applying mechanism includes a first air-core coil arranged on a flat plane which is parallel with said processed surface of said object and contains said discharge electrode, a second air-core coil arranged on said flat plane which is parallel with said processed surface of said object and contains said orifices, and a third air-core coil arranged symmetrically to said first air-core coil with respect to said second air-core coil.

17. A plasma processing equipment according to claim 16, further comprising a fourth air-core coil for generating a magnetic filed strength distribution to reduce a magnetic flux density at a position of said object.

18. A plasma processing equipment according to claim 14, wherein said accelerating electrodes are arranged on an outside of said region in which said magnetic field strength is minimal.

19. A plasma processing equipment according to claim 14, wherein said region in which said magnetic field strength is minimal is positioned in vicinity of said orifices.

20. A plasma processing equipment according to claim 14, wherein said discharge plasma is generated by a direct current discharge.

21. A plasma processing equipment according to claim 20, further comprising a cathode, a discharge electrode, and an intermediate electrode arranged between them to generate said discharge plasma, wherein said discharge plasma is generated by a discharge between said cathode and said discharge electrode.

22. A plasma processing equipment according to claim 14, wherein said discharge plasma is generated by an application of a high frequency or a microwave.

23. A plasma processing equipment according to claim 22, further comprising a mechanism for supplementing said electrons to said discharge plasma.

24. A plasma processing equipment comprising:
a discharge vessel in which a discharge chamber for generating a discharge plasma is formed;
a vacuum vessel in which a process chamber for generating an excited plasma by exciting a process gas by virtue of electrons which are extracted from said discharge plasma is formed;
a partition in which a compartment is formed, said compartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma; and
accelerating electrodes arranged on a surface of said partition facing said process chamber to extract said electrons through said orifices.

25. A plasma processing equipment according to claim 24, wherein said accelerating electrodes are further formed on inner surfaces of said orifices.

26. A plasma processing equipment according to claim 24, wherein said partition is formed of insulating material, and said accelerating electrodes are made of a conductive film which is formed on a surface of said partition by a deposition.

27. A plasma processing equipment according to claim 24, wherein said discharge plasma is generated by a direct current discharge.

28. A plasma processing equipment according to claim 27, further comprising a cathode, a discharge electrode, and an intermediate electrode arranged between them to generate said discharge plasma, wherein said discharge plasma is generated by a discharge between said cathode and said discharge electrode.

29. A plasma processing equipment according to claim 24, wherein said discharge plasma is generated by an application of a high frequency or a microwave.

30. A plasma processing equipment according to claim 29, further comprising a mechanism for supplementing said electrons to said discharge plasma.

31. A plasma processing equipment comprising:
a discharge vessel in which a discharge chamber for generating a discharge plasma is formed;
a vacuum vessel in which a process chamber for generating an excited plasma by exciting a process gas by virtue of electrons which are extracted from said discharge plasma is formed;
a partition in which a compartment is formed, said compartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma; and
an accelerating electrode for extracting said electrons through said orifices, wherein said accelerating electrode has a gas supplying port for introducing said process gas into said process chamber.

32. A plasma processing equipment according to claim 31, wherein said accelerating electrode is formed of a heat resisting material which can resist a heat in processing said object.

33. A plasma processing equipment according to claim 31, wherein said discharge plasma is generated by a direct current discharge.

34. A plasma processing equipment according to claim 33, further comprising a cathode, a discharge electrode, and an intermediate electrode arranged between them to generate said discharge plasma, wherein said discharge plasma is generated by a discharge between said cathode and said discharge electrode.

35. A plasma processing equipment according to claim 31, wherein said discharge plasma is generated by an application of a high frequency or a microwave.

36. A plasma processing equipment according to claim 35, further comprising a mechanism for supplementing said electrons to said discharge plasma.

37. A plasma processing equipment comprising:
a discharge vessel in which a discharge chamber for generating a discharge plasma is formed;
a vacuum vessel in which a process chamber for generating an excited plasma by exciting a process gas by virtue of electrons which are extracted from said discharge plasma is formed;
a partition in which a compartment is formed as annular shape, said annular compartment being communicated with said discharge chamber and protruding into said process chamber, said partition having a plurality of orifices for extracting said electrons from said discharge plasma toward said process chamber, said orifices being formed such that said electrons are emitted through said orifices along a direction parallel to a processed surface of an object which is to be processed by said excited plasma; and
an accelerating electrode formed as annular shape and arranged in said process chamber so as to surround said partition to extract said electrons through said orifices.

* * * * *